(12) United States Patent
Sato

(10) Patent No.: US 10,411,143 B2
(45) Date of Patent: Sep. 10, 2019

(54) SOLID-STATE IMAGING ELEMENT, METHOD FOR MANUFACTURING SOLID-STATE IMAGING ELEMENT, AND ELECTRONIC DEVICE

(71) Applicant: Sony Corporation, Tokyo (JP)

(72) Inventor: Naoyuki Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/878,813

(22) Filed: Jan. 24, 2018

(65) Prior Publication Data

US 2018/0151757 A1    May 31, 2018

Related U.S. Application Data

(63) Continuation of application No. 14/277,391, filed on May 14, 2014, now Pat. No. 9,911,870, which is a (Continued)

(30) Foreign Application Priority Data

Jan. 25, 2011  (JP) ................................. 2011-012818

(51) Int. Cl.
  *H01L 31/02*   (2006.01)
  *H01L 27/146*  (2006.01)

(52) U.S. Cl.
  CPC .... *H01L 31/02005* (2013.01); *H01L 27/1461* (2013.01); *H01L 27/1464* (2013.01);
  (Continued)

(58) Field of Classification Search
  CPC ........... H01L 27/14636; H01L 27/1469; H01L 27/14634; H01L 27/1461; H01L 27/1464; H01L 27/14645; H01L 31/02005
  See application file for complete search history.

(56) References Cited

U.S. PATENT DOCUMENTS 6,238,865 B1 *  5/2001  Huang ................... C12P 19/34
                                                      435/6.1
7,180,077 B1    2/2007  Farhoomand
                    (Continued)

FOREIGN PATENT DOCUMENTS

JP    01-205465     8/1989
JP    2005-135988   5/2005
                    (Continued)

*Primary Examiner* — Ahmed N Sefer
(74) *Attorney, Agent, or Firm* — Michael Best & Friedrich LLP

(57) ABSTRACT

A solid-state imaging element including: a sensor substrate in which a photoelectric conversion section is arranged and formed; a circuit substrate in which a circuit for driving the photoelectric conversion section is formed, the circuit substrate being laminated to the sensor substrate; a sensor side electrode drawn out to a surface of the sensor substrate on a side of the circuit substrate and formed as one of a projection electrode and a depression electrode; and a circuit side electrode drawn out to a surface of the circuit substrate on a side of the sensor substrate, formed as one of the depression electrode and the projection electrode, and joined to the sensor side electrode in a state of the circuit side electrode and the sensor side electrode being fitted together.

20 Claims, 13 Drawing Sheets

Related U.S. Application Data continuation of application No. 13/337,961, filed on Dec. 27, 2011, now Pat. No. 8,766,389.

(52) U.S. Cl.
CPC .... *H01L 27/1469* (2013.01); *H01L 27/14634* (2013.01); *H01L 27/14636* (2013.01); *H01L 27/14645* (2013.01)

(56) References Cited

U.S. PATENT DOCUMENTS

| | | |
|---|---|---|
| 2005/0219392 A1 | 10/2005 | Suzuki |
| 2008/0210982 A1 | 9/2008 | Han |
| 2009/0065823 A1 | 3/2009 | Hwang |
| 2010/0019346 A1 | 1/2010 | Erturk et al. |
| 2010/0065949 A1 | 3/2010 | Thies et al. |
| 2010/0102368 A1 | 4/2010 | Matsushima et al. |
| 2010/0238334 A1 | 9/2010 | Takahashi |
| 2010/0258890 A1 | 10/2010 | Ahn |
| 2011/0049336 A1 | 3/2011 | Matsunuma |
| 2011/0155893 A1 | 6/2011 | Endo et al. |
| 2012/0146173 A1 | 6/2012 | Ohta et al. |
| 2014/0284744 A1* | 9/2014 | Fujii .................. H01L 27/1469 257/431 |

FOREIGN PATENT DOCUMENTS

| | | |
|---|---|---|
| JP | 2006-191081 A | 7/2006 |
| JP | 2006-237103 | 9/2006 |
| JP | 2007-234725 A | 9/2007 |

\* cited by examiner

FIG. 8
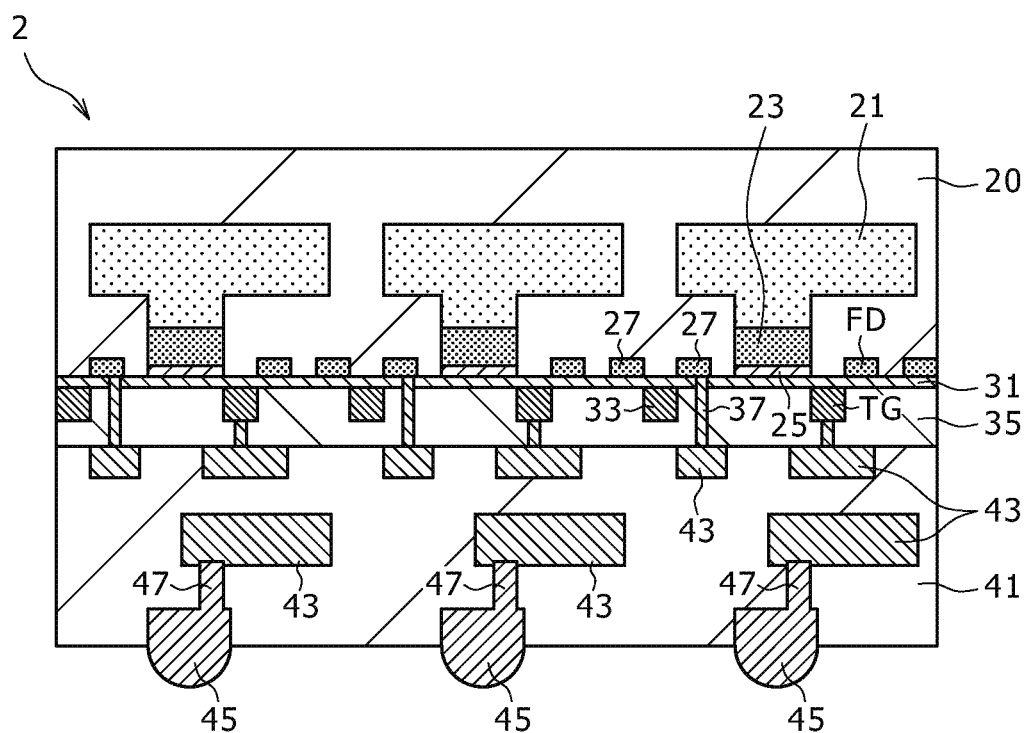
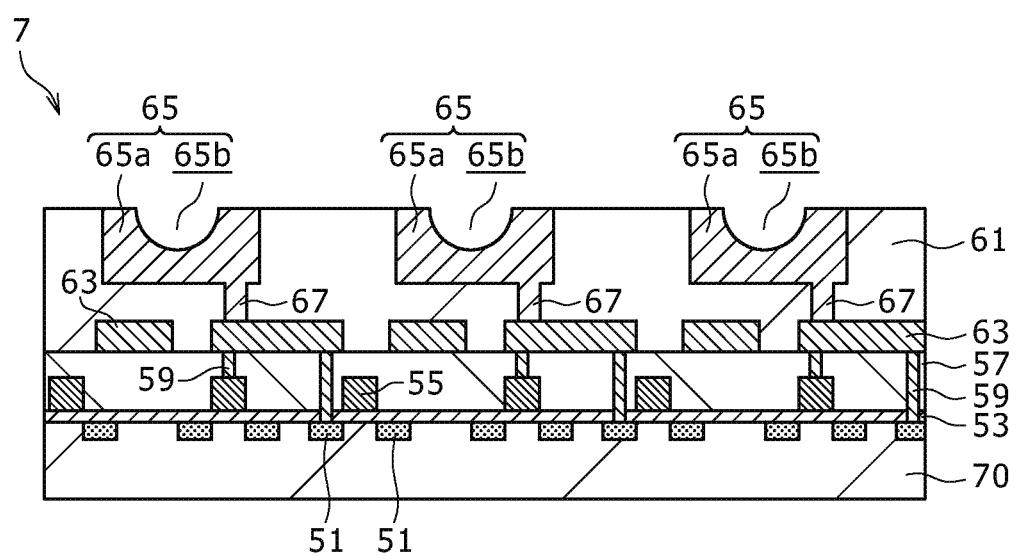

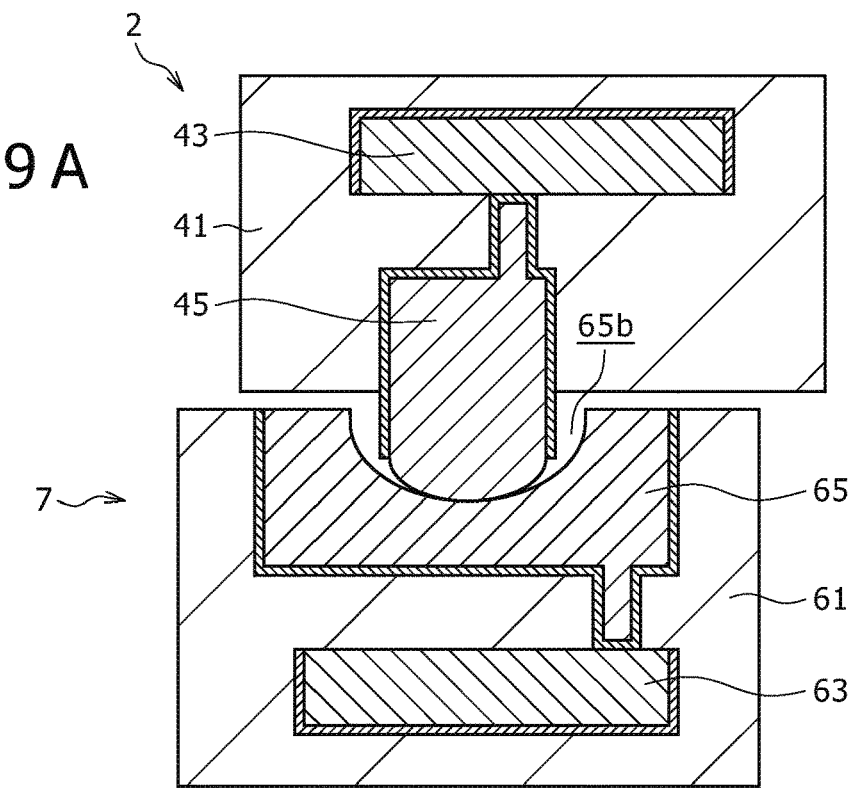
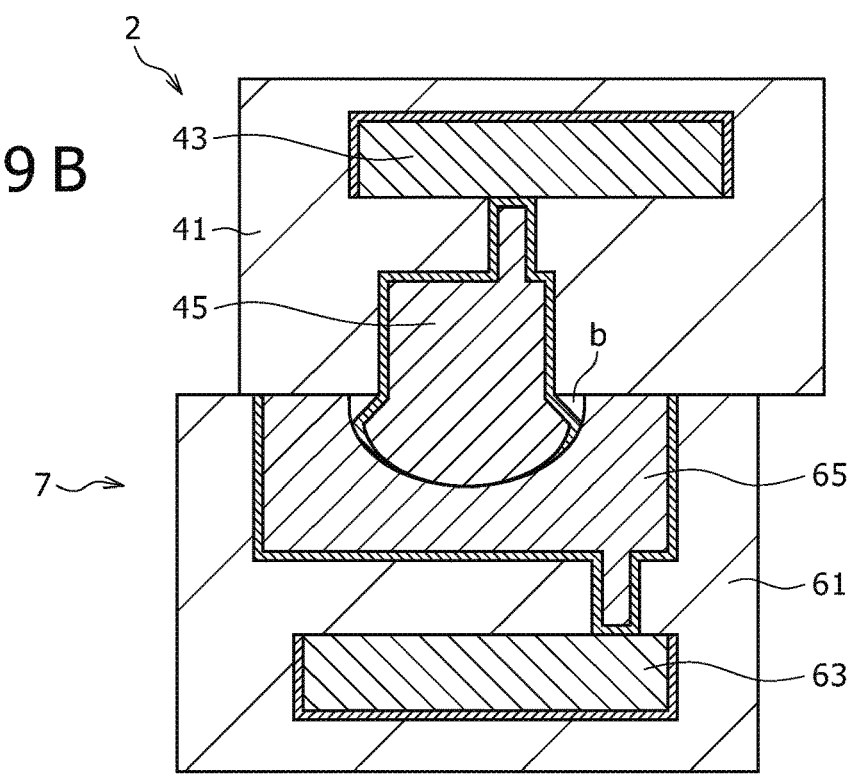

SOLID-STATE IMAGING ELEMENT, METHOD FOR MANUFACTURING SOLID-STATE IMAGING ELEMENT, AND ELECTRONIC DEVICE

CROSS REFERENCE TO RELATED APPLICATIONS

The present invention is a Continuation of U.S. application Ser. No. 14/277,391, filed May 14, 2014, which is a Continuation of U.S. application Ser. No. 13/337,961, filed Dec. 27, 2011, now U.S. Pat. No. 8,766,389, Jul. 1, 2014, which claims priority from Japanese Priority Patent Application 2011-012818 filed Jan. 25, 2011, the entire contents of which are incorporated herein by reference.

BACKGROUND

The present disclosure relates to a solid-state imaging element formed by laminating a sensor substrate and a circuit substrate to each other in such a manner as to join the electrodes of the sensor substrate and the circuit substrate to each other, a method for manufacturing the solid-state imaging element, and an electronic device using the solid-state imaging element.

A three-dimensional structure in which a photoelectric conversion section and a peripheral circuit section are laminated to each other is proposed as one of structures for achieving further miniaturization of elements and higher density of pixels in a solid-state imaging element included in an electronic device such as a portable telephone, a digital camera, a camcorder, or the like.

In manufacturing a solid-state imaging element of such a three-dimensional structure, for example a sensor substrate in which a CIS (complementary metal oxide semiconductor image sensor) having a photoelectric conversion section is formed and a circuit substrate in which a peripheral circuit section is formed are laminated to each other. The lamination of these substrates is performed by arranging electrodes (bonding pads) drawn out to surfaces on one side of each of the substrates such that the electrodes (bonding pads) are opposed to each other, and performing heat treatment in this state. In order to facilitate the joining of the bonding pads to each other by the heat treatment, an insulating film surrounding bonding pads is recessed in advance (see Japanese Patent Laid-Open No. 2006-191081, for example, for the above description).

In addition, a constitution in which the sensor substrate and the circuit substrate are laminated to each other so as to cancel the internal stress of both of the substrates is proposed in order to prevent a distortion or a warp in the sensor substrate and the circuit substrate laminated as described above (see Japanese Patent Laid-Open No. 2007-234725, for example, for the above description).

SUMMARY

However, in the solid-state imaging element of the three-dimensional structure having the constitution described above, when the heat treatment is performed in a state of the electrodes on the sensor substrate and the electrodes on the circuit substrate being opposed to each other, a void tends to occur at the joining surface between the electrodes of the sensor substrate and the electrodes of the circuit substrate, thus reducing a joining area between the electrodes. Such a reduction of the joining area between the electrodes is a factor in causing an increase in contact resistance between the electrodes of the sensor substrate and the electrodes of the circuit substrate and peeling between the substrates due to a decrease in mechanical strength of the joining surfaces.

Accordingly, it is desirable to provide a solid-state imaging element of a three-dimensional structure that makes it possible to secure a joining area between electrodes in a constitution formed by laminating a sensor substrate and a circuit substrate to each other in such a manner as to join the electrodes of the sensor substrate and the circuit substrate to each other, and improve reliability. It is also desirable to provide a method for manufacturing such a solid-state imaging element and an electronic device whose reliability is improved by using such a solid-state imaging element.

A solid-state imaging element according to an embodiment of the present technology includes: a sensor substrate in which a photoelectric conversion section is arranged and formed; and a circuit substrate in which a circuit for driving the photoelectric conversion section is formed, the circuit substrate being laminated to the sensor substrate. The solid-state imaging element also includes: a sensor side electrode drawn out to a surface of the sensor substrate on a side of the circuit substrate; and a circuit side electrode drawn out to a surface of the circuit substrate on a side of the sensor substrate. In the solid-state imaging element, the sensor side electrode and the circuit side electrode are joined to each other in a state of a projection electrode being fitted in a depression electrode.

In the solid-state imaging element of such a constitution, the joining surface between the sensor side electrode and the circuit side electrode of the constitution in which the projection electrode is fitted in the depression electrode has a larger joining area than in a case in which flat electrodes are joined to each other. Thus, even when a void occurs at the joining surface between the sensor side electrode and the circuit side electrode, a substantial joining area can be secured.

In addition, a method for manufacturing a solid-state imaging element according to an embodiment of the present technology performs the following steps. First, a sensor side electrode is formed on one main surface side of a sensor substrate in which a photoelectric conversion section is arranged and formed. In addition, a circuit side electrode is formed on one main surface side of a circuit substrate in which a circuit for driving the photoelectric conversion section is formed. Next, the sensor side electrode and the circuit side electrode are joined to each other by arranging the sensor substrate and the circuit substrate such that the sensor substrate and the circuit substrate are opposed to each other and laminating the sensor substrate and the circuit substrate to each other in a state of the sensor side electrode and the circuit side electrode being opposed to each other, and performing heat treatment. In the method performing such steps, the sensor substrate and the circuit substrate are laminated to each other in a state of a projection electrode forming one of the sensor side electrode and the circuit side electrode being fitted in a depression electrode forming the other of the electrodes.

In the above manufacturing method, the sensor substrate and the circuit substrate are laminated to each other on a self-alignment basis by fitting the projection electrode into the depression electrode, and a solid-state imaging element of the above-described constitution can be obtained.

Another embodiment of the present technology is an electronic device having a solid-state imaging element of the above constitution.

As described above, according to the present technology, a substantial joining area between the sensor side electrode and the circuit side electrode can be ensured in the constitution in which the sensor substrate and the circuit substrate are laminated to each other in such a manner as to join the electrodes of the sensor substrate and the circuit substrate to each other. Thus, an increase in contact resistance is suppressed, and a joining strength between the electrodes is ensured, so that the reliability of the solid-state imaging element of the three-dimensional structure and the electronic device using the solid-state imaging element can be improved.

BRIEF DESCRIPTION OF THE DRAWINGS

FIG. 8 is a sectional process view (1) of a manufacturing method according to the first embodiment;

FIGS. 9A and 9B are principal part sectional process views of the joining of electrodes in the manufacturing method according to the first embodiment;

DETAILED DESCRIPTION OF THE PREFERRED EMBODIMENTS

Figure 1:
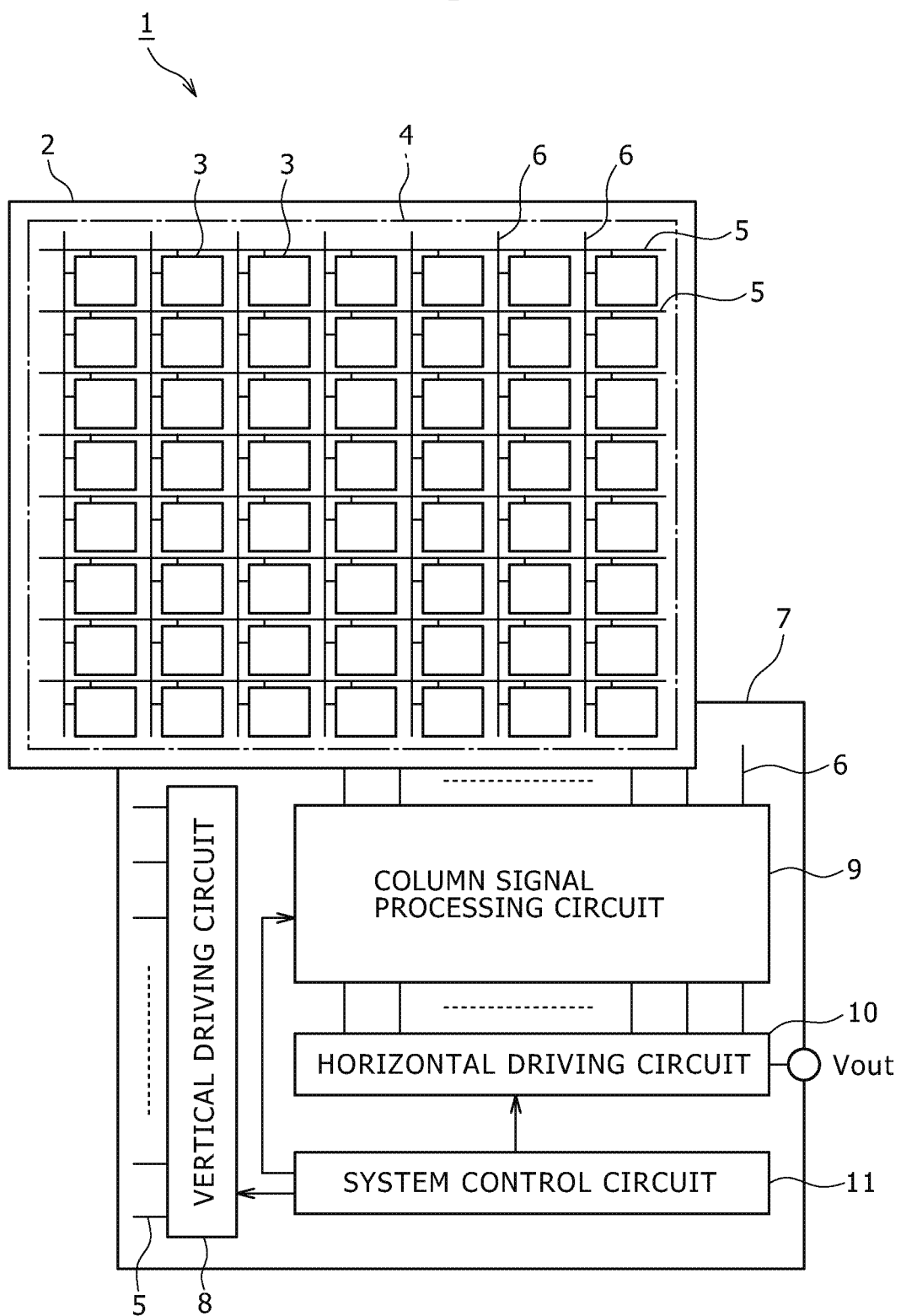
FIG. 1 is a schematic block diagram of a solid-state imaging element to which the present technology is applied.

Preferred embodiments of the present technology will hereinafter be described in the following order with reference to the drawings.

1. Example of Schematic Configuration of Solid-State Imaging Element according to Embodiment
2. Constitution of Solid-State Imaging Element according to First Embodiment
3. Method for Manufacturing Sensor Substrate Used in First Embodiment
4. Method for Manufacturing Circuit Substrate Used in First Embodiment
5. Method for Manufacturing Solid-State Imaging Element according to First Embodiment
6. Constitution of and Method for Manufacture of Solid-State Imaging Element according to Second Embodiment
7. Constitution of and Method for Manufacture of Solid-State Imaging Element according to Third Embodiment
8. Embodiment of Electronic Device Incidentally, common constituent elements in embodiments and examples of modification are identified by same reference numerals, and repeated description thereof will be omitted.

«1. Example of Schematic Configuration of Solid-State Imaging Element according to Embodiment»

FIG. 1 shows a schematic configuration of a MOS (metal oxide semiconductor) type solid-state imaging element as an example of a solid-state imaging element fabricated by applying a manufacturing method according to each embodiment of the present technology. The solid-state imaging element 1 shown in FIG. 1 is a solid-state imaging element of a so-called three-dimensional structure including a sensor substrate 2 and a circuit substrate 7 laminated to the sensor substrate 2 in a state of being stacked on the sensor substrate 2.

A pixel region 4 in which a plurality of pixels 3 including a photoelectric conversion section are regularly arranged two-dimensionally is provided on one surface side of the sensor substrate 2. In the pixel region 4, a plurality of pixel driving lines 5 are arranged in a row direction, a plurality of vertical signal lines 6 are arranged in a column direction, and one pixel 3 is disposed in a state of being connected to one pixel driving line 5 and one vertical signal line 6. Each of these pixels 3 has a pixel circuit formed by a photoelectric conversion section, a charge accumulating section, a plurality of transistors (so-called MOS transistors), a capacitive element, and the like. Incidentally, a part of the pixel circuit may be shared by a plurality of pixels.

In addition, peripheral circuits such as a vertical driving circuit 8, a column signal processing circuit 9, a horizontal driving circuit 10, a system control circuit 11, and the like are provided on one surface side of the circuit substrate 7.

The vertical driving circuit 8 is formed by a shift register, for example. The vertical driving circuit 8 selects the pixel driving lines 5 drawn out from the side of the sensor substrate 2 to the side of the circuit substrate 7, supplies a pulse for driving the pixels to the selected pixel driving lines 5, and drives the pixels 3 arranged on the side of the sensor substrate 2 in row units. That is, the vertical driving circuit 8 sequentially selects and scans each of the pixels 3 arranged in the sensor substrate 2 in row units in a vertical direction. Then, a pixel signal based on a signal charge generated according to an amount of light received in each of the pixels 3 is supplied to the column signal processing circuit 9 via the vertical signal lines 6 arranged so as to be perpendicular to the pixel driving lines 5.

The column signal processing circuit 9 is arranged for example for each column of the pixels 3 provided in the sensor substrate 2. The column signal processing circuit 9 subjects signals output from pixels 3 of one row via the vertical signal lines 6 to signal processing for noise removal and the like for each pixel column. Specifically, the column signal processing circuit 9 performs signal processing such as correlated double sampling (CDS) for removing fixed pattern noise specific to the pixels, signal amplification, analog/digital conversion (AD), and the like.

The horizontal driving circuit 10 is formed by a shift register, for example. The horizontal driving circuit 10 sequentially outputs a horizontal scanning pulse, and selects each of constituent parts of the column signal processing circuit 9 in order, to make each of the constituent parts of the column signal processing circuit 9 output a pixel signal.

The system control circuit 11 receives an input clock and data specifying an operation mode and the like, and outputs data such as internal information of the solid-state imaging element 1 and the like. Specifically, the system control circuit 11 generates a clock signal and a control signal serving as a reference for the operation of the vertical driving circuit 8, the column signal processing circuit 9, the horizontal driving circuit 10, and the like on the basis of a vertical synchronizing signal, a horizontal synchronizing signal, and a master clock. The system control circuit 11 then inputs these signals to the vertical driving circuit 8, the column signal processing circuit 9, the horizontal driving circuit 10, and the like.

A circuit for driving each pixel is formed by the peripheral circuits 8 to 11 as described above and the pixel circuit of each pixel 3 provided in the sensor substrate 2.

«2. Constitution of Solid-State Imaging Element according to First Embodiment»

Figure 2:
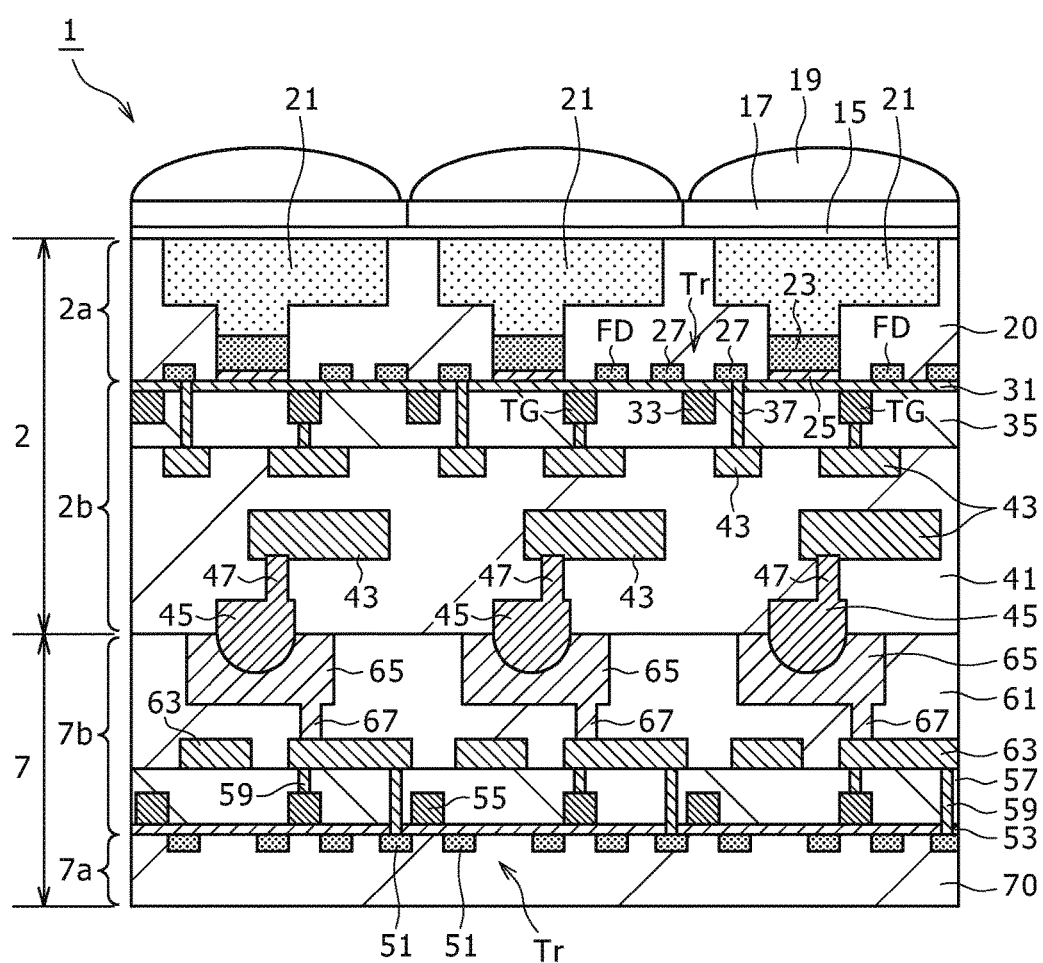
FIG. 2 is a principal part sectional view of a constitution of a solid-state imaging element according to a first embodiment.

FIG. 2 is a principal part sectional view showing a constitution of the solid-state imaging element according to the first embodiment, and is a sectional view of three pixels in FIG. 1. A detailed constitution of the solid-state imaging element according to the first embodiment will be described in the following on the basis of the principal part sectional view.

The solid-state imaging element 1 shown in FIG. 2 is a solid-state imaging element of the three-dimensional structure in which the sensor substrate 2 and the circuit substrate 7 are laminated to each other in a state of being stacked on each other, as described above. The sensor substrate 2 includes a semiconductor layer 2a and a wiring layer 2b disposed on a surface of the semiconductor layer 2a which surface is on the side of the circuit substrate 7. The circuit substrate 7 includes a semiconductor layer 7a and a wiring layer 7b disposed on a surface of the semiconductor layer 7a which surface is on the side of the sensor substrate 2.

In addition, a protective layer 15, a color filter layer 17, and an on-chip lens 19 are laminated in this order on a surface of the sensor substrate 2 which surface is on an opposite side from the circuit substrate 7. Next, detailed constitutions of the respective layers forming the sensor substrate 2 and the circuit substrate 7 will be described in order from the side of the sensor substrate 2.

[Semiconductor Layer 2a (on Side of Sensor Substrate 2)]

The semiconductor layer 2a on the side of the sensor substrate 2 is a layer in the form of a thin film having a single crystal structure, and is formed by thinning a semiconductor substrate made of single crystal silicon, for example. In the semiconductor layer 2a, a photoelectric conversion section 21 formed of an n-type impurity layer (or a p-type impurity layer), for example, is provided for each pixel on the side of a first surface on which the color filter layer 17 and the like are arranged. The following description will be made supposing that the photoelectric conversion section 21 is formed of an n-type impurity layer as an example. In this case, a part of the semiconductor layer 2a which part surrounds the photoelectric conversion section 21 is of a p+ type, and functions as an element isolation region.

The photoelectric conversion section 21 is disposed so as to have an aperture width narrowed from the side of the first surface of the semiconductor layer 2a (side of the color filter layer 17) to the side of a second surface of the semiconductor layer 2a as an opposite side. A charge transferring section 23 formed of an n+ type impurity and a charge accumulating section 25 for holes which section is formed of a p+ type impurity layer are provided in this order in the part of the photoelectric conversion section 21 which part has the narrowed aperture width on the side of the second surface of the semiconductor layer 2a. The charge accumulating section 25 is disposed along the second surface of the semiconductor layer 2a.

A floating diffusion FD and source/drain sections 27 of a transistor Tr, the floating diffusion FD and the source/drain sections 27 being formed of an n+type impurity layer, as well as an impurity layer serving as a lower electrode of a capacitive element not shown in FIG. 2 are provided in a surface layer on the side of the second surface of the semiconductor layer 2a (side of the wiring layer 2b).

[Wiring Layer 2b (on Side of Sensor Substrate 2)]

The wiring layer 2b on the side of the sensor substrate 2 is formed by a multilayer wiring structure, for example. The wiring layer 2b has a transfer gate TG and a gate electrode 33 of the transistor provided on a gate insulating film 31 as well as an upper electrode of the capacitive element not shown in FIG. 2 on the side of an interface between the wiring layer 2b and the semiconductor layer 2a. The transfer gate TG is disposed between the floating diffusion FD and the charge transferring section 23. The gate electrode 33 is disposed between the source/drain sections 27. The transfer gate TG and the gate electrode 33 are formed of polysilicon, for example, provided for each pixel, and covered with an interlayer insulating film 35.

In the wiring layer 2b, an interlayer insulating film 41 is further laminated on the interlayer insulating film 35. Wiring 43 whose insulation is secured by the interlayer insulating film 41 is provided over multiple layers. Further, a sensor side electrode 45 is drawn out to the surface of the interlayer insulating film 41 which surface is on the side of the circuit substrate 7.

A connecting hole 37 reaching the source/drain section 27 or the transfer gate TG is provided in a part of the interlayer insulating film 35 and the gate insulating film 31. The wiring 43 is connected to the source/drain section 27 or the transfer gate TG via the connecting hole 37. Suppose that a connecting hole not shown in FIG. 2 is also provided in the interlayer insulating film 41, so that connection is established between pieces of wiring 43 and 43 in different layers. Further, a connecting hole 47 for connecting the wiring 43 and the sensor side electrode 45 to each other is provided in the interlayer insulating film 41. The sensor side electrode 45 is connected to the photoelectric conversion section 21 or the transistor Tr provided on the side of the second surface of the semiconductor layer 2a via the wiring 43.

Suppose that the sensor substrate 2 formed as described above has a pixel circuit formed by the floating diffusion FD, the transfer gate TG, the transistor Tr, and the capacitive element not shown in FIG. 2 in conjunction with the photoelectric conversion section 21. Incidentally, a part of the pixel circuit may be shared by a plurality of pixels (photoelectric conversion sections 21).

In the present first embodiment, the sensor side electrode 45 is formed as a projection electrode projecting from the surface of the interlayer insulating film 41. The part of the projection electrode formed as the sensor side electrode 45 which part projects from the interlayer insulating film 41 may be a part or the whole of the sensor side electrode 45.

Suppose that for example a part of each such projection electrode which part is embedded in the interlayer insulating film 41 has a cylindrical shape, and that the bottom surface side of a cylinder in the part of the projection electrode which part projects from the interlayer insulating film 41 is formed as a convex curved surface in a substantially hemispheric shape. In addition, the whole of the projection electrode having the convex curved surface on the one bottom surface side of such a cylindrical shape may be disposed on the interlayer insulating film 41. Further, each projection electrode may have a shape formed by a wide base part and a convex curved surface in a substantially hemispheric shape provided on an upper part of the base part. In this case, only the part of the convex curved surface in the substantially hemispheric shape may be projected from the interlayer insulating film 41, and the surface of the base part may be at a same height as the surface of the interlayer insulating film 41.

[Semiconductor Layer 7a (on Side of Circuit Substrate 7)]

The semiconductor layer 7a on the side of the circuit substrate 7 is a layer in the form of a thin film having a single crystal structure, and is formed by thinning a semiconductor substrate made of single crystal silicon, for example. In the semiconductor layer 7a, well layers of respective conductivity types not shown in FIG. 2 are provided on a surface side of the semiconductor layer 7a on which surface side the sensor substrate 2 is disposed, and source/drain sections 51 of a transistor Tr are provided so as to be of respective conductivity types in a surface layer of the well layers. In addition, an impurity layer forming a lower electrode of a capacitive element not shown in FIG. 2 is provided in the surface layer of the well layers.

[Wiring Layer 7b (on Side of Circuit Substrate 7)]

The wiring layer 7b on the side of the circuit substrate 7 is formed by a multilayer wiring structure, for example. The wiring layer 7b has a gate electrode 55 provided on a gate insulating film 53 as well as an upper electrode of the capacitive element not shown in FIG. 2 at an interface on the side of the semiconductor layer 7a. The gate electrode 55 is disposed between the source/drain sections 51. The gate electrode 55 and the upper electrode are formed of polysilicon, for example, provided for each pixel, and covered with an interlayer insulating film 57.

In the wiring layer 7b, an interlayer insulating film 61 is further laminated on the interlayer insulating film 57. Wiring 63 whose insulation is secured by the interlayer insulating film 61 is provided over multiple layers as required. Further, a circuit side electrode 65 is drawn out to the surface of the interlayer insulating film 61 which surface is on the side of the sensor substrate 2.

A connecting hole 59 reaching the source/drain section 51 or the gate electrode 55 is provided in a part of the interlayer insulating film 57 and the gate insulating film 53. The wiring 63 is connected to the source/drain section 51 or the gate electrode 55 via the connecting hole 59. In addition, when the wiring 63 is in multiple layers, pieces of wiring 63 and 63 in different layers are connected to each other by a connecting hole provided in the interlayer insulating film 61. Further, a connecting hole 67 for connecting the wiring 63 and the circuit side electrode 65 to each other is provided in the interlayer insulating film 61. The circuit side electrode 65 is connected to the transistor Tr provided in the surface of the semiconductor layer 7a via the wiring 63.

Suppose that the circuit substrate 7 formed as described above has a peripheral circuit formed by the transistor Tr, the capacitive element not shown in FIG. 2, and the like.

In the present first, the circuit side electrode 65 is formed as a depression electrode. Suppose that such a circuit side electrode 65 has a concave shape in the central part of a surface of the circuit side electrode 65 which surface faces the side of the sensor substrate 2, and that the inner circumferential wall of the concave shape is formed by a concave curved surface where the electrode surface of the circuit side electrode 65 is exposed.

Each projection electrode formed as the sensor side electrode 45 on the side of the sensor substrate 2 described earlier is fitted into each depression electrode formed as the circuit side electrode 65 as described above, and the circuit side electrodes 65 and the sensor side electrodes 45 are joined to each other in a one-to-one correspondence. A joining surface between the circuit side electrodes 65 and the sensor side electrodes 45 is a curved surface. In addition, the peripheries of the projection electrodes (sensor side electrodes 45) projecting from the interlayer insulating film 41 are surrounded by the depression electrodes (circuit side electrodes 65).

Suppose that the projection electrodes (sensor side electrodes 45) and the depression electrodes (circuit side electrodes 65) are formed of a material capable of being joined to each other while retaining a good contact property, and that the material is used for the projection electrodes (sensor side electrodes 45) and the depression electrodes (circuit side electrodes 65) with process compatibility taken into consideration.

In addition, suppose that in this state, the entire surface of the interlayer insulating film 41 on the side of the sensor substrate 2 and the entire surface of the interlayer insulating film 61 on the side of the circuit substrate 7 are in close contact with each other. In this case, when the interlayer insulating films 41 and 61 are formed of a silicon oxide base material, the interlayer insulating films 41 and 61 are joined to each other by an intermolecular bond between silicon (Si) and oxygen (O).

[Protective Film 15]

The protective film 15 is formed by a material film having a passivation property. A silicon oxide film, a silicon nitride film, a silicon oxynitride film, or the like is used for the protective film 15.

[Color Filter Layer 17]

The color filter layer 17 is formed by color filters of respective colors provided in a one-to-one correspondence with respective photoelectric conversion sections 21. The arrangement of the color filters of the respective colors is not limited.

[On-Chip Lens 19]

On-chip lenses 19 are provided in a one-to-one correspondence with the respective photoelectric conversion sections 21 and the color filters of the respective colors which color filters form the color filter layer 17, and are formed so as to condense incident light on the respective photoelectric conversion sections 21.

[Action and Effect of Solid-State Imaging Element according to First Embodiment]

According to the solid-state imaging element 1 formed as described above, the sensor side electrode 45 is formed as a projection electrode, the circuit side electrode 65 is formed as a depression electrode, and the sensor side electrode 45 and the circuit side electrode 65 are joined to each other by fitting the projection electrode into the depression electrode. Thus, a joining area between the sensor side electrode 45 and the circuit side electrode 65 is larger than in a case in which flat electrodes are joined to each other. Thus, even when a void occurs at the joining surface between the sensor side electrode 45 and the circuit side electrode 65 in a joining process, for example, a substantial joining area can be secured.

In addition, because of the constitution in which the projection electrode is fitted into the depression electrode in a plane in which the sensor substrate 2 and the circuit substrate 7 are opposed to each other, a strength against stress from a horizontal direction with respect to the laminated state can be obtained.

As a result, in the solid-state imaging element 1 of the three-dimensional structure formed by laminating the sensor substrate 2 and the circuit substrate 7 in such a manner as to join the electrodes 45 and 65 to each other, it is possible to prevent an increase in contact resistance between the electrodes 45 and 65 and secure a joining strength, and thus improve reliability.

«3. Method for Manufacturing Sensor Substrate Used in First Embodiment»

Figure 3A:
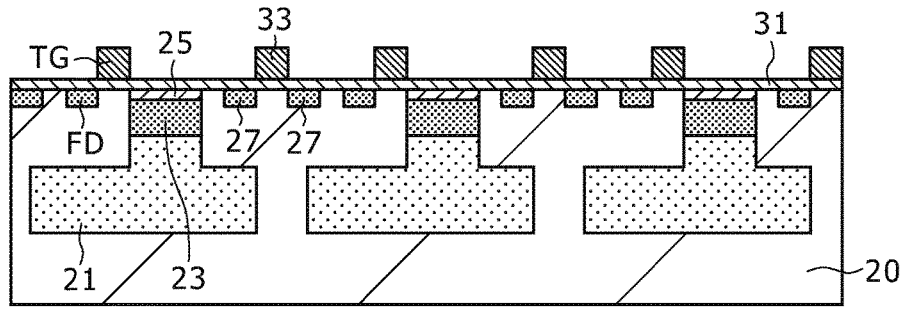
FIGS. 3A, 3B, and 3C are sectional process views of a method for manufacturing a sensor substrate used in the first embodiment.
Figure 3B:
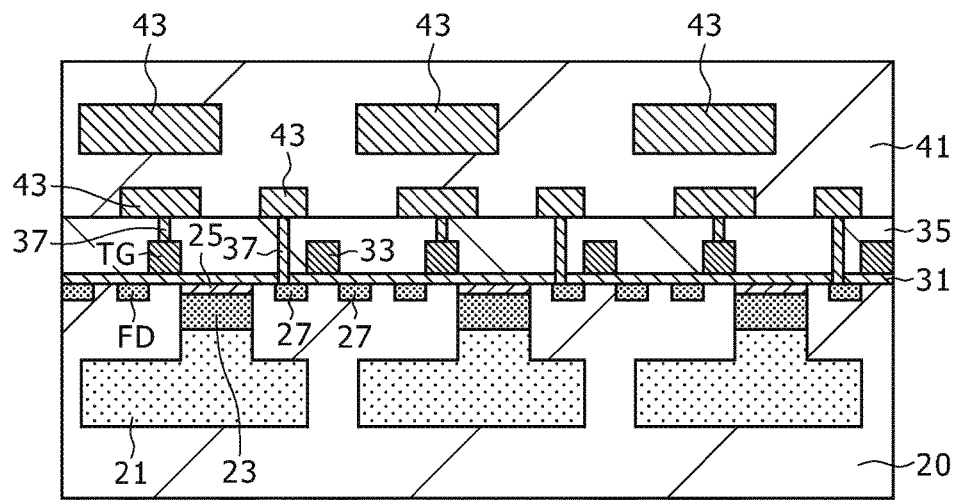
Figure 3C:
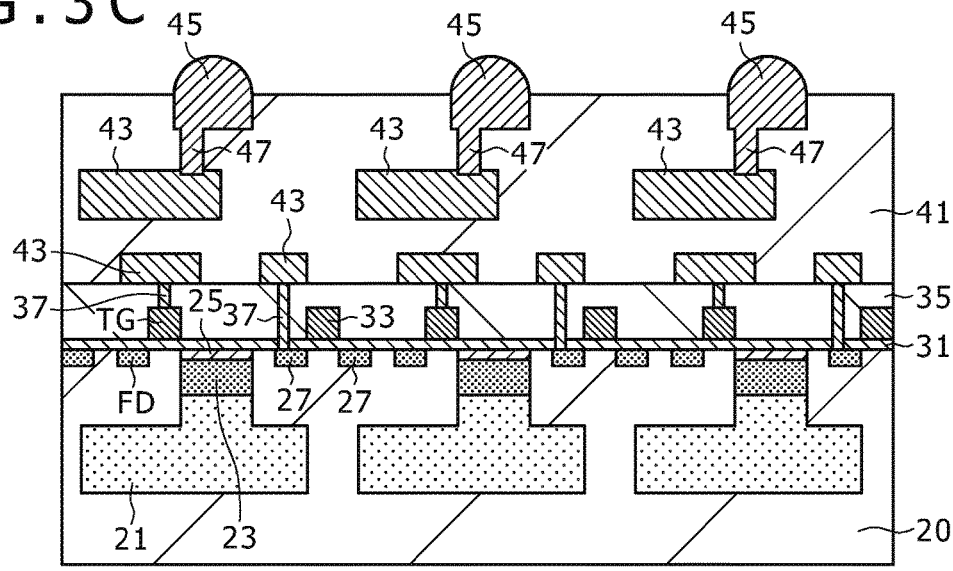

FIGS. 3A, 3B, and 3C are sectional process views of assistance in explaining a method for manufacturing the sensor substrate used in manufacturing the solid-state imaging element of the constitution described in the first embodiment. FIGS. 4A, 4B, 4C, and 4D are principal part sectional process views of the formation of an electrode in the sensor substrate. The method for manufacturing the sensor substrate used in the first embodiment will be described in the following with reference to these figures.

[FIG. 3A]

First, as shown in FIG. 3A, a single crystal silicon substrate, for example, is prepared as a semiconductor substrate 20. A well region made of a p-type impurity layer not shown in FIG. 3A is formed in the surface layer of the semiconductor substrate 20, and a photoelectric conversion section 21 made of an n-type impurity layer is formed at a predetermined depth within the well region. Further, a charge transferring section 23 made of an n+ type impurity layer and a charge accumulating section 25 for holes, the charge accumulating section 25 being made of a p+ type impurity layer, are formed in the surface layer of the photoelectric conversion section 21. In addition, a floating diffusion FD and source/drain sections 27 made of an n+ type impurity layer as well as a lower electrode of a capacitive element not shown in FIG. 3A are formed.

The formation of these impurity layers is performed by impurity introduction from the surface side of the semiconductor substrate 20, and is for example performed by ion implantation from above a mask and subsequent activating heat treatment. The ion implantation is performed with implantation energy set appropriately according to the depth of each of the impurity layers.

Next, a gate insulating film 31 is formed using a silicon oxide film or a silicon nitride film on the surface of the semiconductor substrate 20 in which surface the charge accumulating section 25 is formed. Further, a transfer gate TG and a gate electrode 33 made of polysilicon are formed on the gate insulating film 31. The transfer gate TG is formed between the floating diffusion FD and the charge transferring section 23. The gate electrode 33 is formed between the source/drain sections 27. In addition, an upper electrode of the capacitive element not shown in FIG. 3A is formed in the same process as the above.

The process up to the above is not particularly limited in process procedure, but can be performed by an appropriate procedure. For example, after the transfer gate TG and the gate electrode 33 are formed on the gate insulating film 31, ion implantation for forming the floating diffusion FD and the source/drain sections 27 may be performed with the transfer gate TG and the gate electrode 33 used as a mask.

[FIG. 3B]

Next, as shown in FIG. 3B, an interlayer insulating film 35 made of silicon oxide, for example, is formed on the semiconductor substrate 20 in a state of covering the transfer gate TG and the gate electrode 33. Thereafter, connecting holes reaching the transfer gate TG and one of the source/drain sections 27 are formed in the interlayer insulating film 35 and the gate insulating film 31.

Next, the formation of wiring 43 connected to each of the transfer gate TG and one of the source/drain sections 27 via the connecting holes 37, the formation of an interlayer insulating film 41, the formation of the wiring 43, and the formation of the interlayer insulating film 41 are performed repeatedly. Suppose that the wiring 43 is formed by using a metallic material having excellent conductivity such as aluminum, tungsten, molybdenum, or the like. The interlayer insulating film 41 is formed by using an appropriate material, and may be formed by a laminated structure using different materials. Suppose that the interlayer insulating film 41 in an uppermost layer is formed by a film having an excellent embedding property, and is formed with a flat surface.

Incidentally, it suffices to perform the above forming process according to an ordinary semiconductor process, and the process procedure is not limited. For example, a so-called damascene process may be applied to the formation of the wiring 43. In this case, the wiring 43 can be formed by using a metallic material unsuitable for an etching process, such as copper (Cu) or the like.

[FIG. 3C]

Next, as shown in FIG. 3C, a sensor side electrode 45 connected to the wiring 43 is formed in the interlayer insulating film 41 in the uppermost layer. This sensor side electrode is formed as a projection electrode projecting from the interlayer insulating film 41.

FIGS. 4A to 4D represent a forming procedure in a case where such a projection electrode (sensor side electrode 45 in this case) is formed by an embedding method. An example of a method for forming the projection electrode (sensor side electrode 45) will be described in the following with reference to FIGS. 4A to 4D.

[FIG. 4A]

Figure 4A:
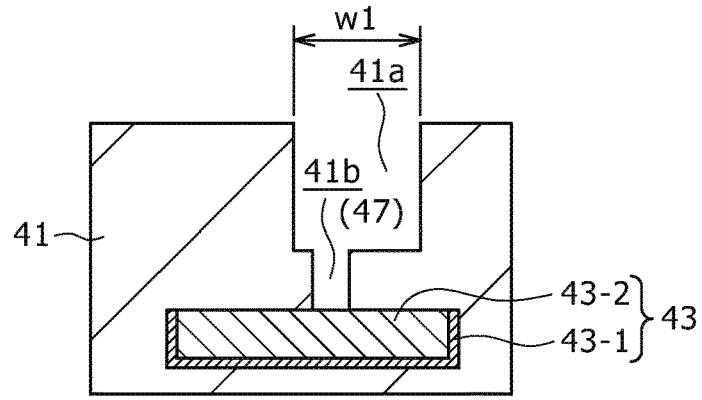
FIGS. 4A, 4B, 4C, and 4D are principal part sectional process views of the formation of a projection electrode formed in the first embodiment.

First, as shown in FIG. 4A, a depression part 41a for forming the electrode and a hole part 41b (connecting hole 47 shown in FIG. 2) reaching the wiring 43 from the bottom part of the depression part 41a are formed in the surface layer of the interlayer insulating film 41 covering the wiring 43. Suppose that the depression part 41a has a cylindrical inner peripheral shape, for example. The formation of the depression part 41a and the hole part 41b is performed by forming a mask on the interlayer insulating film 41 by applying a lithography method and etching the interlayer insulating film 41 from above the mask. Either of the formation of the depression part 41a and the formation of the hole part 41b may be performed first. A process of removing the mask is performed after the completion of the etching, and post-treatment by organic cleaning is further performed.

[FIG. 4B]

Figure 4B:
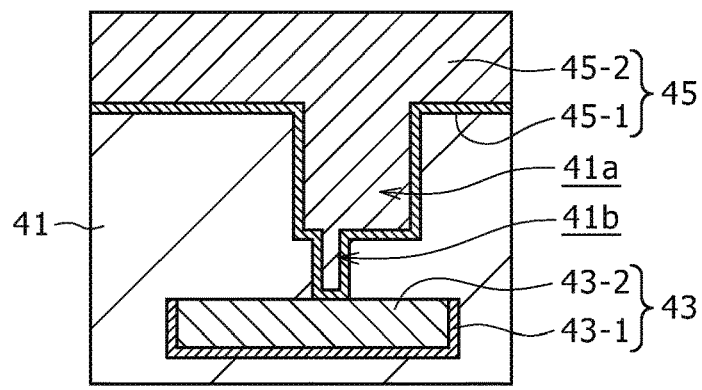

Next, as shown in FIG. 4B, a barrier metal layer 45-1 is formed on the interlayer insulating film 41 in a state of covering the inner walls of the hole part 41b and the depression part 41a, and a copper (Cu) film 45-2 is formed in a state of sufficiently filling the hole part 41b and the depression part 41a. The barrier metal layer 45-1 is to prevent the diffusion of copper, and is formed of tantalum nitride (TaN), titanium nitride (TiN), or the like. It suffices to provide the barrier metal layer 45-1 as required. The formation of the copper (Cu) film 45-2 is performed by the formation of a seed layer on the barrier metal layer 45-1 and film formation on the seed layer by a plating method. Incidentally, in this case, as an example, the wiring 43 is also shown as embedded wiring composed of a barrier metal layer 43-1 and a copper (Cu) film 43-2 formed by a damascene process.

[FIG. 4C]

Figure 4C:
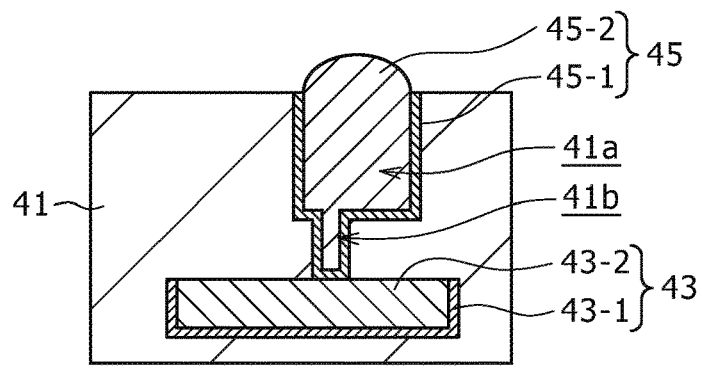

Next, as shown in FIG. 4C, an excess copper (Cu) film 45-2 and an excess barrier metal layer 45-1 on the interlayer insulating film 41 are removed to leave the copper (Cu) film 45-2 and the barrier metal layer 45-1 only within the depression part 41$a$ and on the depression part 41$a$. In this case, for example, chemical mechanical polishing (hereinafter referred to as CMP) is performed from above the copper (Cu) film 45-2. Thus, a cylindrical sensor side electrode 45 composed of the copper (Cu) film 45-2 and the barrier metal layer 45-1 is formed within the depression part 41$a$ of the cylindrical inner peripheral shape.

In addition, after the sensor side electrode 45 individuated within each depression part 41$a$ is formed by the CMP, the polishing is continued further with a CMP condition set such that polishing speed is [Interlayer Insulating Film 41 >Sensor Side Electrode 45]. For the CMP condition relating to such polishing speed, a nonselective polishing slurry polishing all of Cu, the barrier metal, and the interlayer film, for example HS-T815 (manufactured by Hitachi Chemical Co., Ltd.) is used as a slurry for the barrier metal film. By adjusting the concentration of hydrogen peroxide used as an oxidizing agent to 0 to 0.5 wt %, the polishing of Cu as a main component of the sensor side electrode 45 can be suppressed sufficiently with respect to the polishing of silicon oxide ($SiO_2$) forming the interlayer insulating film 41.

By thus adjusting the polishing speed and continuing performing the CMP, the polishing of the interlayer insulating film 41 progresses faster than that of the sensor side electrode 45, thus resulting in a shape such that the sensor side electrode 45 projects from the interlayer insulating film 41. In addition, the projection corner part of the sensor side electrode 45 projecting from the interlayer insulating film 41 is gradually formed into a round shape by the polishing. Thus, the polishing is continued until the part of the sensor side electrode 45 which part projects from the interlayer insulating film 41 as a whole forms a convex curved surface in a substantially hemispheric shape.

[FIG. 4D]

Figure 4D:
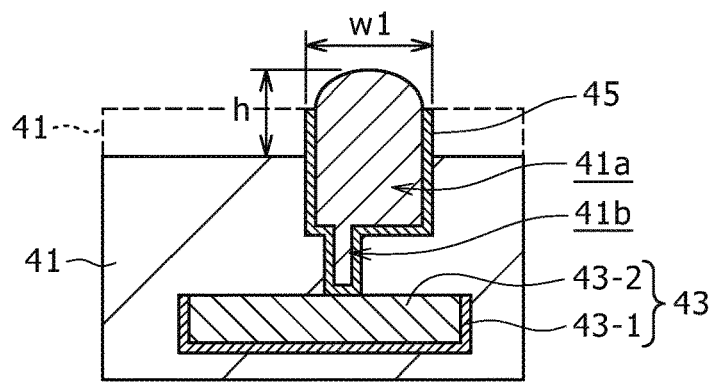

Thereafter, as shown in FIG. 4D, the projection height h of the sensor side electrode 45 from the interlayer insulating film 41 is adjusted by making only the interlayer insulating film 41 receding by etching as required. For example, in a case of etching of the interlayer insulating film 41 made of a silicon oxide ($SiO_2$) base material, the etching is performed with a dilute hydrofluoric acid used as an etchant. At this time, the interlayer insulating film 41 may be etched until the whole of the sensor side electrode 45 is projected.

As a result of the above processes, the sensor side electrode 45 drawn out to the surface on the side of the sensor substrate 2 projects from the interlayer insulating film 41 to the projection height h, and is formed as a projection electrode whose protruding section has a width w1 and whose protruding section is formed in a substantially hemispheric shape.

«4. Method for Manufacturing Circuit Substrate Used in First Embodiment»

FIGS. 5A, 5B, 5C, and 5D are sectional process views of assistance in explaining a method for manufacturing the circuit substrate used in manufacturing the solid-state imaging element of the constitution described in the first embodiment. FIGS. 6A, 6B, 6C, and 6D and FIGS. 7A and 7B are principal part sectional process views of the formation of an electrode in the circuit substrate. The method for manufacturing the circuit substrate used in the first embodiment will be described in the following with reference to these figures.

[FIG. 5A]

Figure 5A:
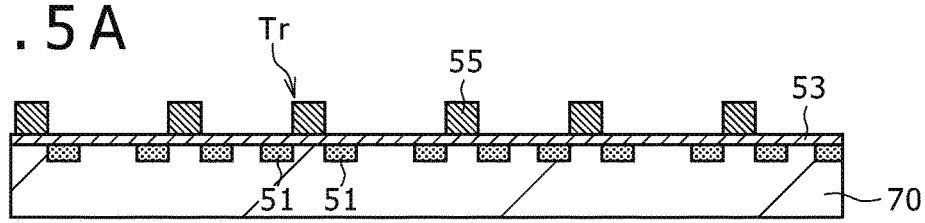
FIGS. 5A, 5B, 5C, and 5D are sectional process views of a method for manufacturing a circuit substrate used in the first embodiment.

First, as shown in FIG. 5A, a single crystal silicon substrate, for example, is prepared as a semiconductor substrate 70. A well region composed of impurity layers of respective conductivity types not shown in FIG. 5A is formed in the surface layer of the semiconductor substrate 70, and source/drain sections 51 of respective conductivity types and a lower electrode of a capacitive element not shown in FIG. 5A are formed in the surface layer of the well region.

The formation of these impurity layers is performed by impurity introduction from the surface side of the semiconductor substrate 70, and is for example performed by ion implantation from above a mask and subsequent activating heat treatment. The ion implantation is performed with implantation energy set appropriately according to the depth of each of the impurity layers.

Next, a gate insulating film 53 is formed using a silicon oxide film or a silicon nitride film on the surface of the semiconductor substrate 70 in which surface the source/drain sections 51 are formed. Further, a gate electrode 55 made of polysilicon is formed on the gate insulating film 53. The gate electrode 55 is formed between the source/drain sections 51. In addition, an upper electrode of the capacitive element not shown in FIG. 5A is formed in the same process as the above.

The process up to the above is not particularly limited in process procedure, but can be performed by an appropriate procedure. For example, after the gate electrode 55 is formed on the gate insulating film 53, ion implantation for forming the source/drain sections 51 may be performed with the gate electrode 55 used as a mask.

[FIG. 5B]

Figure 5B:
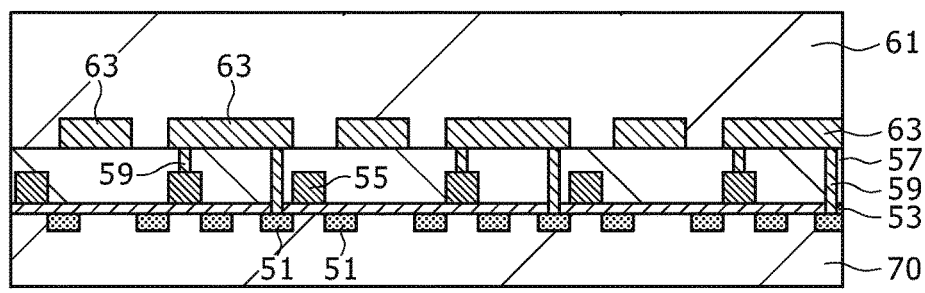

Next, as shown in FIG. 5B, an interlayer insulating film 57 is formed on the semiconductor substrate 70 in a state of covering the gate electrode 55. Further, connecting holes 59 reaching the gate electrode 55 and one of the source/drain sections 51, respectively, are formed in the interlayer insulating film 57 and the gate insulating film 53.

Next, the formation of wiring 63 connected to each of the gate electrode 55 and one of the source/drain sections 51 via the connecting holes 59 and the formation of an interlayer insulating film 61 are performed repeatedly as required. Suppose that the wiring 63 is formed by using a metallic material having excellent conductivity such as aluminum, tungsten, molybdenum, or the like. In addition, suppose that the interlayer insulating film 61 in an uppermost layer is formed by a film having an excellent embedding property, and is formed with a flat surface.

Incidentally, it suffices to perform the above forming process according to an ordinary semiconductor process, and the process procedure is not limited. For example, a so-called damascene process may be applied to the formation of the wiring 63. In this case, the wiring 63 can be formed by using a metallic material unsuitable for an etching process, such as copper (Cu) or the like.

[FIG. 5C]

Figure 5C:
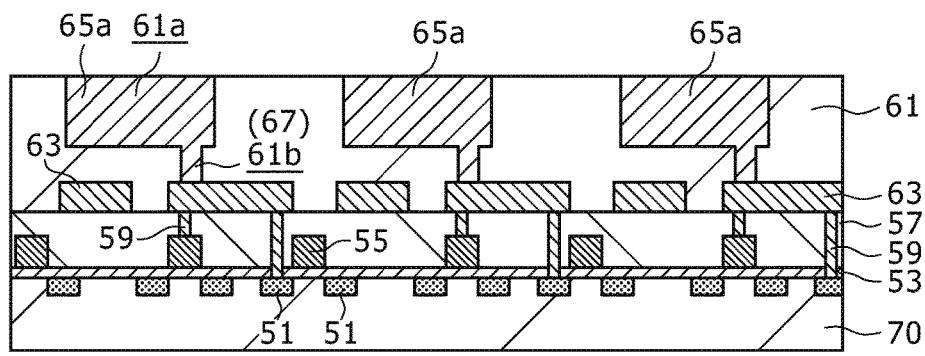

Next, as shown in FIG. 5C, an embedded electrode 65$a$ connected to the wiring 63 is formed in a state of being exposed on the surface side of the interlayer insulating film 61. The embedded electrode 65$a$ is formed by a damascene method, for example.

In this case, first, a depression part 61$a$ for the electrode and a hole part 61$b$ (connecting hole 67 shown in FIG. 2)

reaching the wiring 63 from the bottom part of the depression part 61a are formed in the surface layer of the interlayer insulating film 61. Suppose that the depression part 61a is a size larger and deeper than a depression part in a depression electrode to be formed in a next process. The formation of the depression part 61a and the hole part 61b is performed by forming a mask on the interlayer insulating film 61 by applying a lithography method and etching the interlayer insulating film 61 from above the mask. Either of the formation of the depression part 61a and the formation of the hole part 61b may be performed first. A process of removing the mask is performed after the completion of the etching, and post-treatment by organic cleaning is further performed.

Next, an embedded wiring material film composed of a barrier metal layer and a copper (Cu) film, for example, is formed on the interlayer insulating film 61. The barrier metal layer is to prevent the diffusion of copper, and is formed of tantalum (Ta), titanium (Ti), or the like. The formation of the copper (Cu) film is performed by the formation of a seed layer on the barrier metal layer and film formation on the seed layer by a plating method. The copper (Cu) film is formed with such a film thickness as to sufficiently fill the depression part 61a.

Next, an excess copper (Cu) film and an excess barrier metal layer on the interlayer insulating film 61 are removed by a CMP method, for example, to leave the copper (Cu) film and the barrier metal layer only within the depression part 61a, so that the embedded electrode 65a individuated within each depression part 61a is formed. In this case, the CMP surface of the embedded electrode 65a may be flat.
[FIG. 5D]

Figure 5D:
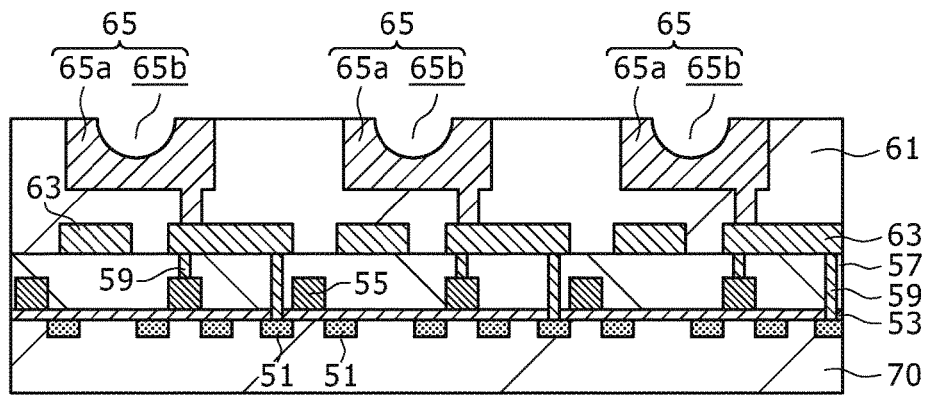

Thereafter, as shown in FIG. 5D, a depression part 65b is formed in the central part of the embedded electrode 65a, so that a depression electrode is formed. Thus, a circuit side electrode 65 made of the depression electrode connected to the wiring 63 is formed in the uppermost layer of the interlayer insulating film 61.
[FIGS. 6A to 6D]

FIGS. 6A to 6D represent a first example of a procedure for forming such a depression electrode (circuit side electrode 65 in this case). The first example of the method for forming the depression electrode (circuit side electrode 65) will be described in the following with reference to FIGS. 6A to 6D.
[FIG. 6A]

Figure 6A:
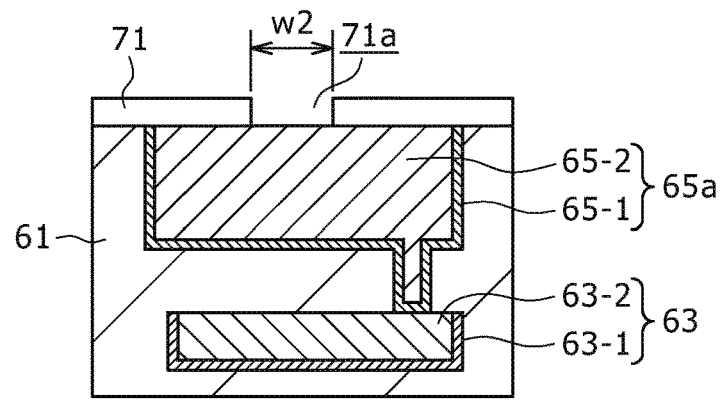
FIGS. 6A, 6B, 6C, and 6D are principal part sectional process views of a first example of the formation of a depression electrode formed in the first embodiment.

First, as shown in FIG. 6A, a mask pattern 71 is formed on the interlayer insulating film 61 and the embedded electrode 65a formed on the surface side of the interlayer insulating film 61. This mask pattern 71 is formed by using a resist material, for example, by a lithography process, and has an aperture 71a at the central part of the embedded electrode 65a. Suppose that the aperture 71a has an aperture width w2 narrower than the depression part (65b) to be formed in the embedded electrode 65a. Suppose in this case that the embedded electrode 65a is formed by a barrier metal layer 65-1 and a copper (Cu) film 65-2, as described above. Incidentally, in this case, as an example, the wiring 63 is also shown as embedded wiring composed of a barrier metal layer 63-1 and a copper (Cu) film 63-2 formed by a damascene process.
[FIG. 6B]

Figure 6B:
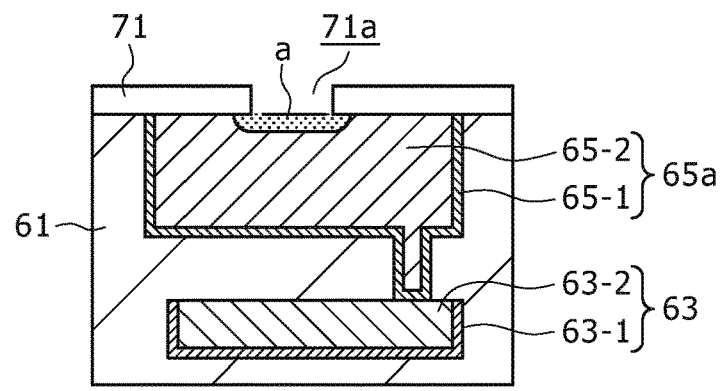

Next, as shown in FIG. 6B, the surface of the copper (Cu) film 65-2 of the embedded electrode 65a exposed to the aperture 71a of the mask pattern 71 is treated with a hydrogen peroxide solution ($H_2O_2.H_2O$) to form a transformed layer a by being changed into copper oxide ($Cu_2O$). The change into copper oxide ($Cu_2O$) by such a treatment progresses isotropically. The transformed layer a is therefore formed so as to extend also under the mask pattern 71.
[FIG. 6C]

Figure 6C:
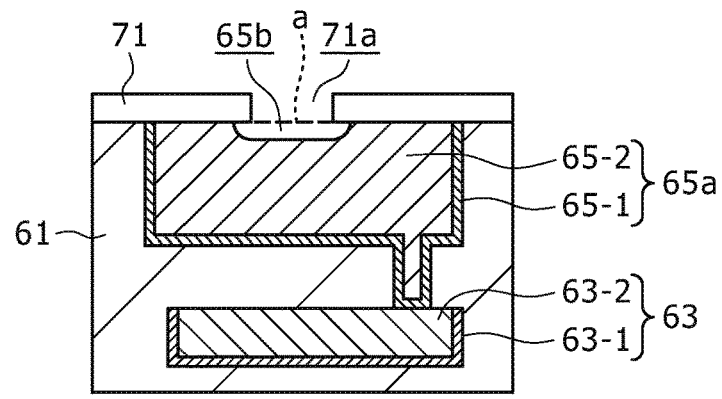
Figure 6D:
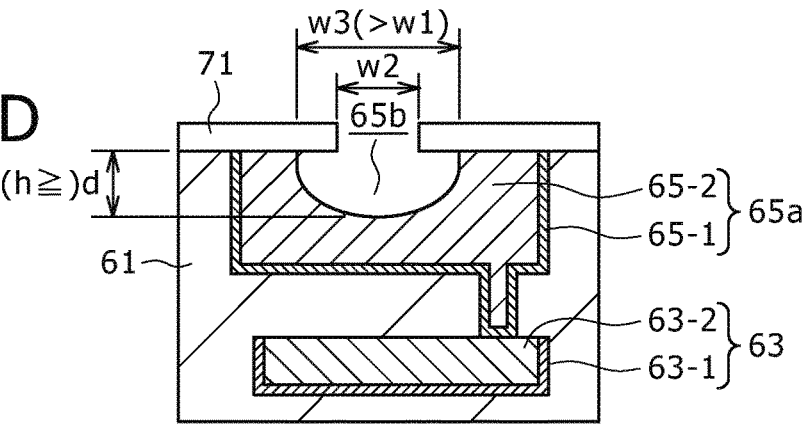

Thereafter, as shown in FIG. 6C, the transformed layer a formed of copper oxide ($Cu_2O$) is selectively removed by etching with respect to the copper (Cu) film 65-2. Such selective etching removal of the transformed layer a is performed by a wet process using a dilute hydrofluoric acid as an etchant. Thus, a depression part 65b is formed in a part from which the transformed layer a is removed. The depression part 65b is formed so as to extend also under the mask pattern 71.
[FIG. 6D]

The depression part 65b on the surface side of the copper (Cu) film 65-2 exposed from the aperture 71a of the mask pattern 71 is expanded to an aperture width w3 and a depth d by repeatedly performing the formation of a transformed layer a and the selective removal of the transformed layer a as described above. Thus, the circuit side electrode 65 drawn out to the surface on the side of the circuit substrate 7 is formed as a depression electrode having the depression part 65b of the aperture width w3 and the depth d. In this repeated process, the depression part 65b expands isotropically. Thus, as the repeated process progresses, the inner circumferential wall of the depression part 65b is formed into the shape of a curved surface from a side wall part, and an area occupied by the shape of the curved surface increases.

Suppose in this case that the aperture width w3 of the depression part 65b is larger than the width w1 of the projection electrode formed earlier (see FIG. 4D). Thus, the projection part of the projection electrode (sensor side electrode 45) can be fitted into the depression part 65b of the depression electrode (circuit side electrode 65). In addition, a process margin at the time of fitting the projection part of the depression electrode (sensor side electrode 45) into the depression part 65b of the depression electrode (circuit side electrode 65) can be secured by designing the aperture width w3 of the depression part 65b to be sufficiently larger than the width w1 of the projection electrode.

In addition, suppose that the depth d of the depression part 65b does not exceed the projection height h of the projection electrode formed earlier (see FIG. 4D). An end of the projection electrode is abutted against the deepest part of the depression part in a state of the projection part of the projection electrode (sensor side electrode 45) being fitted in the depression part 65b of the depression electrode (circuit side electrode 65). In addition, the curvature of the concave curved surface in the depression part 65b is desirably smaller than or equal to the curvature of the convex curved surface in the projection electrode. Further, the capacity of the depression part 65b is desirably substantially equal to the volume of the protruding section of the projection electrode which protruding section protrudes from the interlayer insulating film within a range not less than the volume of the protruding section.

The mask pattern 71 is removed after the circuit side electrode 65 drawn out to the surface on the side of the circuit substrate 7 is formed as the depression electrode having the depression part 65b in the desired shape as described above. The mask pattern 71 is removed by a wet process using a resist stripper, for example.
[FIGS. 7A and 7B]

Figure 7A:
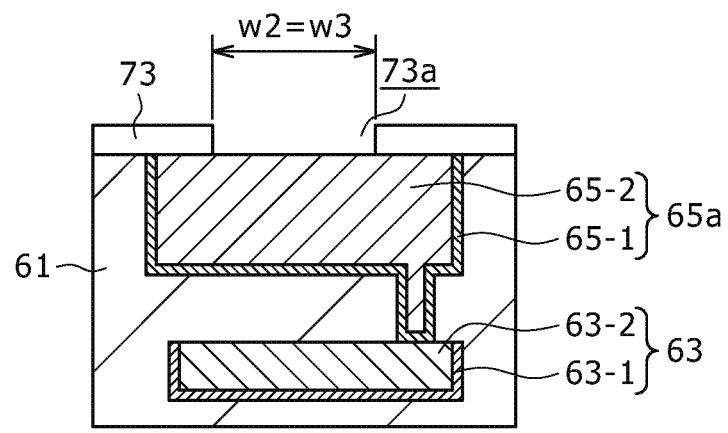
FIGS. 7A and 7B are principal part sectional process views of a second example of the formation of the depression electrode formed in the first embodiment.
Figure 7B:
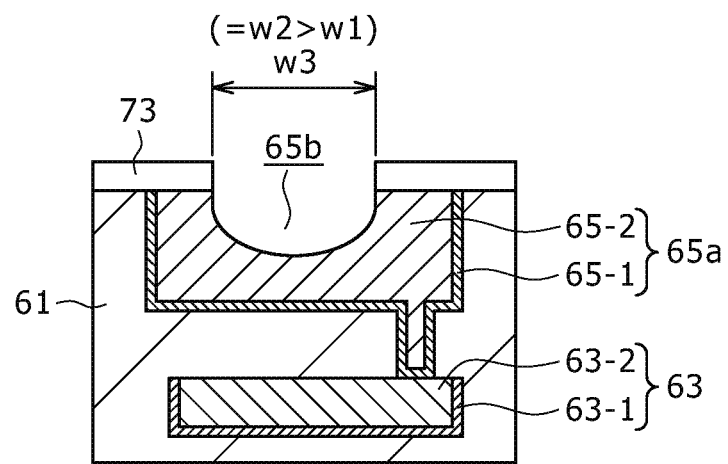

FIGS. 7A and 7B represent a second example of a procedure for forming such a depression electrode (circuit side electrode 65 in this case). The second example of the method for forming the depression electrode (circuit side electrode 65) will be described in the following with reference to FIGS. 7A and 7B.

[FIG. 7A]

First, as shown in FIG. 7A, a mask pattern 73 is formed on the interlayer insulating film 61 and the embedded electrode 65a formed on the surface side of the interlayer insulating film 61. This mask pattern 73 is formed by using a resist material, for example, by a lithography process, and has an aperture 73a at the central part of the embedded electrode 65a. Suppose that the aperture 73a has the same aperture width w3 as the depression part (65b) to be formed in the embedded electrode 65a. Suppose in this case that the embedded electrode 65a is formed by a barrier metal layer 65-1 and a copper (Cu) film 65-2, as described above. Incidentally, in this case, as an example, the wiring 63 is also shown as embedded wiring composed of a barrier metal layer 63-1 and a copper (Cu) film 63-2 formed by a damascene process.

[FIG. 7B]

Next, as shown in FIG. 7B, the copper (Cu) film 65-2 exposed from the aperature 73a of the mask pattern 73 is polished by performing CMP from above the mask pattern 73, whereby the exposed surface of the copper (Cu) film 65-2 is dished to form the depression part 65b. In this case, the aperture width w3, the depth d, the curvature of the concave curved surface, and the capacity of the depression part 65b are set similar to those described above.

The mask pattern 73 is removed after the circuit side electrode 65 drawn out to the surface on the side of the circuit substrate 7 is formed as the depression electrode having the depression part 65b in the desired shape as described above. The mask pattern 73 is removed by a wet process using a resist stripper, for example.

«5. Method for Manufacturing Solid-State Imaging Element according to First Embodiment»

Figure 10:
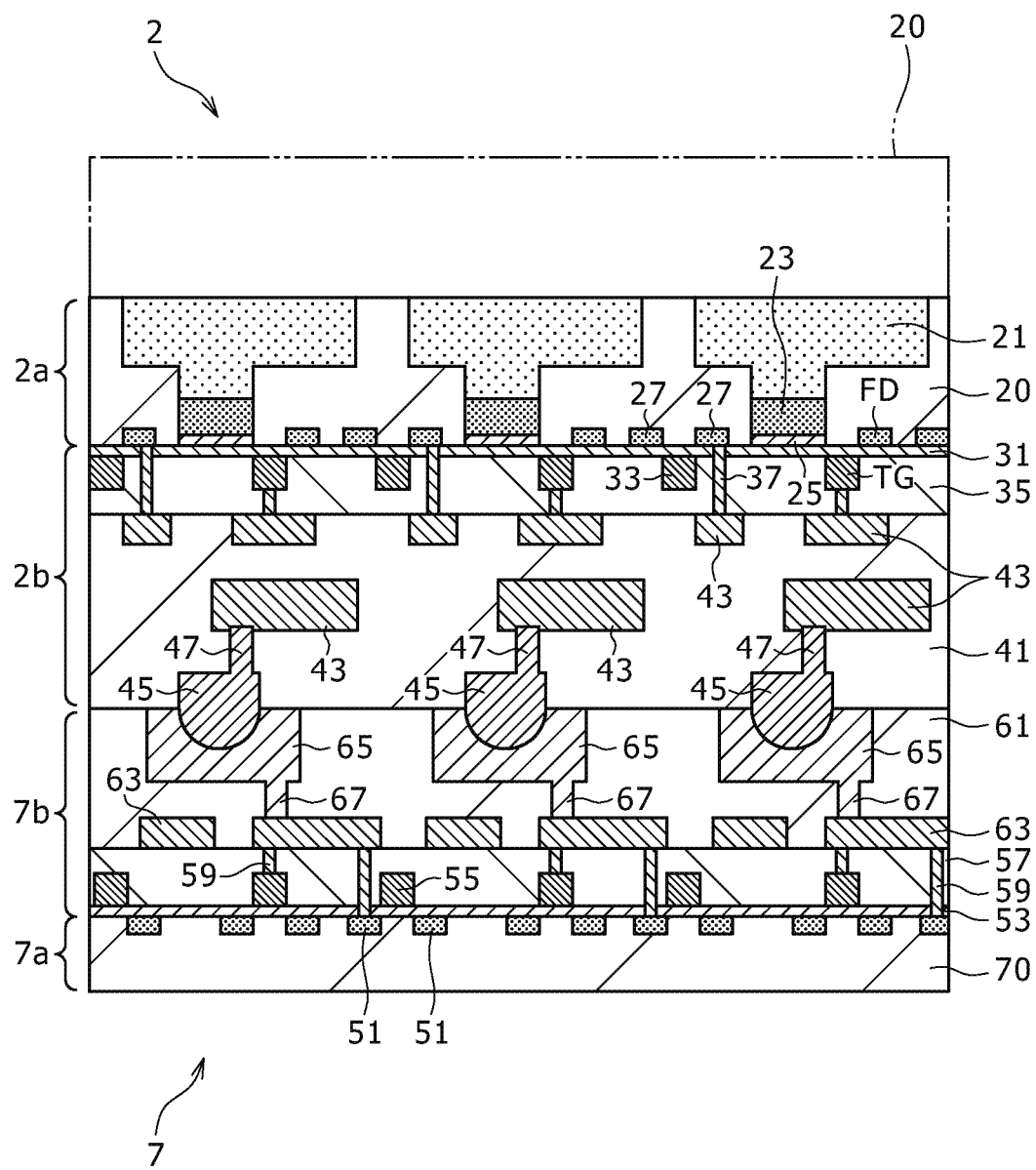
FIG. 10 is a sectional process view (2) of the manufacturing method according to the first embodiment.

A method for manufacturing the solid-state imaging element according to the first embodiment using the sensor substrate and the circuit substrate having the projection electrode and the depression electrode formed by the above-described procedures will next be described with reference to FIGS. 8 to 10.

[FIG. 8]

First, as shown in FIG. 8, the sensor substrate 2 fabricated by the procedure described with reference to FIGS. 3A to 4D and the circuit substrate 7 fabricated by the procedure described with reference to FIGS. 5A to 7B are arranged so as to be opposed to each other with the sensor side electrodes 45 and the circuit side electrodes 65 facing each other. In this state, the sensor substrate 2 and the circuit substrate 7 are roughly aligned to each other so that the sensor side electrodes 45 are in a one-to-one correspondence with the circuit side electrodes 65, and the sensor substrate 2 and the circuit substrate 7 are laminated to each other.

[FIG. 9A]

In this case, as shown in FIG. 9A, when the sensor substrate 2 and the circuit substrate 7 are laminated to each other, a projection electrode as a sensor side electrode 45 is fitted into a depression electrode as a circuit side electrode 65 in a one-to-one correspondence with each other. In this manner, the sensor substrate 2 and the circuit substrate 7 are laminated to each other on a self-alignment basis. In this state, the vertex part of the projection electrode (sensor side electrode 45) is desirably abutted against the bottom part of the depression part 65b of the depression electrode (circuit side electrode 65).

[FIG. 9B]

Next, as shown in FIG. 9B, the projection electrode (sensor side electrode 45) and the depression electrode (circuit side electrode 65) are joined to each other by performing heat treatment. In addition, the interlayer insulating film 41 of the sensor substrate 2 and the interlayer insulating film 61 of the circuit substrate 7 are joined to each other. The temperature and the time of such heat treatment are set according to the material forming the projection electrode (sensor side electrode 45) and the depression electrode (circuit side electrode 65) such that these electrodes 45 and 65 are sufficiently joined to each other within ranges in which elements and wiring formed in the sensor substrate 2 and the circuit substrate 7 are not affected.

For example, when the projection electrode (sensor side electrode 45) and the depression electrode (circuit side electrode 65) are formed of the material having copper (Cu) as a base, heat treatment is performed at 200° C. to 600° C. for about one to five hours. Such heat treatment may be performed under a pressurized atmosphere, or may be performed with the sensor substrate 2 and the circuit substrate 7 pressed from both sides. As an example, Cu—Cu joining is achieved by performing heat treatment at 400° C. for four hours.

Such heat treatment causes the projection electrode (sensor side electrode 45) and the depression electrode (circuit side electrode 65) to be gradually joined to each other from an initial abutment part, and causes the inside of the depression part 65b of the depression electrode to be gradually filled with the projection electrode from the side of the bottom part of the depression part 65b. Thus, the height of the projection electrode is decreased gradually, the interlayer insulating film 41 of the sensor substrate 2 and the interlayer insulating film 61 of the circuit substrate 7 are abutted against each other, and the interlayer insulating film 41 and the interlayer insulating film 61 are joined to each other with an intermolecular bond formed between the silicon oxide forming the interlayer insulating film 41 and the silicon oxide forming the interlayer insulating film 61, for example.

[FIG. 10]

After the sensor substrate 2 and the circuit substrate 7 are laminated to each other and the sensor substrate 2 and the circuit substrate 7 are joined to each other in such a manner as to join the electrodes 45 and 65 to each other and in such a manner as to join the interlayer insulating films 41 and 61 to each other as described above, the semiconductor substrate 20 on the side of the sensor substrate 2 is thinned to form a semiconductor layer 2a and expose the photoelectric conversion sections 21. In addition, the semiconductor substrate 70 on the side of the circuit substrate 7 is thinned to form a semiconductor layer 7a as required.

[FIG. 2]

Thereafter, as shown in FIG. 2, a protective layer 15 is formed on the exposed surfaces of the photoelectric conversion sections 21, and further a color filter layer 17 and an on-chip lens 19 are formed on the protective layer 15, whereby the solid-state imaging element 1 is completed.

In the solid-state imaging element 1 obtained in this manner, the electrodes 45 and 65 are joined to each other by performing heat treatment in a state of the projection electrodes as the sensor side electrodes 45 being fitted into the depression electrodes as the circuit side electrodes 65 in a one-to-one correspondence with each other. Thus, the joining surface between the electrodes 45 and 65 has a shape such that the projection electrodes are fitted in the depression electrodes.

[Action and Effect of Method for Manufacturing Solid-State Imaging Element according to First Embodiment]

According to such a manufacturing method, the sensor substrate 2 and the circuit substrate 7 are laminated to each other such that the projection electrodes formed as the sensor side electrodes 45 are fitted into the depression electrodes formed as the circuit side electrodes 65. Thus, the sensor substrate 2 and the circuit substrate 7 can be aligned to each other with good accuracy on a self-alignment basis.

By designing the aperture width w3 of the depression part 65*b* in the depression electrode (circuit side electrode 65) to be sufficiently larger than the width w1 of the projection electrode at this time, a process margin at the time of fitting the projection part of the projection electrode (sensor side electrode 45) into the depression part 65*b* of the depression electrode (circuit side electrode 65) can be secured.

In addition, the projection electrode (sensor side electrode 45) is formed with a convex curved surface. This prevents damaging the corner part of the projection electrode (sensor side electrode 45) at the time of fitting the projection electrode (sensor side electrode 45) into the depression electrode (circuit side electrode 65). It is thus possible to perform smooth fitting without a hitch, and retain the electrode shapes to ensure reliability.

Further, the height h of the projection part of the projection electrode is made larger than the depth d of the depression part 65*b* in the depression electrode (circuit side electrode 65), and the curvature of the concave curved surface in the depression part 65*b* is smaller than or equal to the curvature of the convex curved surface in the projection electrode. Thus, an end of the projection electrode is abutted against the deepest part of the depression part 65*b* in a state of the projection part of the projection electrode (sensor side electrode 45) being fitted in the depression electrode (circuit side electrode 65), and the joining between the electrodes 45 and 65 can be started promptly from the abutment part of the end of the projection electrode. In particular, because the projection electrode (sensor side electrode 45) has a convex curved surface, the joining between the electrodes 45 and 65 progresses from the end part of the projection electrode to the periphery. It is thus possible to prevent a void from occurring as a result of a gas being trapped in a joining interface between the electrodes 45 and 65, and secure a joining area between the electrodes 45 and 65.

Further, the capacity of the depression part 65*b* in the depression electrode (circuit side electrode 65) is desirably substantially equal to the volume of the protruding section of the projection electrode (sensor side electrode 45) which protruding section protrudes from the interlayer insulating film 41 within a range not less than the volume of the protruding section. Thus, in a state in which the electrodes 45 and 65 are joined to each other, the projection electrode is completely housed within the depression electrode, and the interlayer insulating film 41 of the sensor substrate 2 and the interlayer insulating film 61 of the circuit substrate 7 can be in close contact with each other. Thus, the interlayer insulating films 41 and 61 can be joined to each other by an intermolecular bond, and joining strength between the sensor substrate 2 and the circuit substrate 7 can be ensured.

Incidentally, as shown in FIG. 9B, when there is a large difference between the capacity of the depression part 65*b* and the volume of the protruding section in the projection electrode, voids b can occur in the vicinity of the interface between the sensor substrate 2 and the circuit substrate 7 because the joining between the electrodes 45 and 65 progresses from the deepest part of the depression part 65*b* to the periphery, as described above. It is therefore desirable that the capacity of the depression part 65*b* and the volume of the protruding section in the projection electrode be substantially the same.

«6. Constitution of and Method for Manufacture of Solid-State Imaging Element according to Second Embodiment»

Figure 11A:
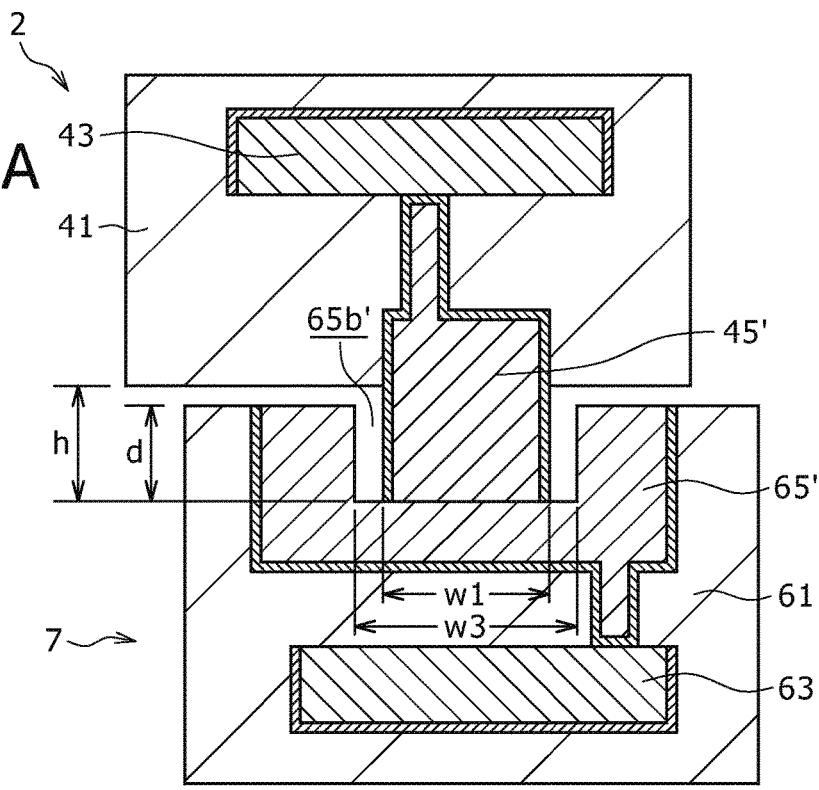
FIGS. 11A and 11B are principal part sectional views of parts of a solid-state imaging element according to a second embodiment.
Figure 11B:
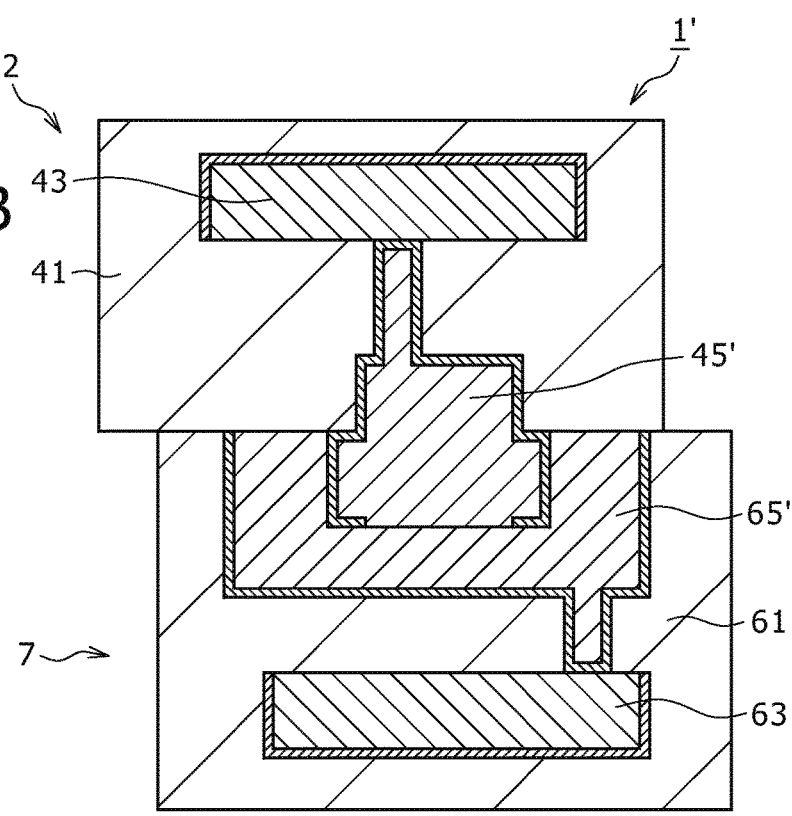

FIGS. 11A and 11B are principal part sectional process views showing parts of a solid-state imaging element according to a second embodiment and the joining of electrodes. The second embodiment will be described in the following with reference to FIGS. 11A and 11B. A difference between the solid-state imaging element 1' according to the second embodiment shown in FIGS. 11A and 11B and the solid-state imaging element according to the first embodiment described earlier lies in the shape of projection electrodes and depression electrodes, and suppose that the other constitution of the solid-state imaging element 1' according to the second embodiment is similar to that of the solid-state imaging element according to the first embodiment.

[FIG. 11A]

As shown in FIG. 11A, the protruding section of a sensor side electrode 45' provided as a projection electrode in a sensor substrate 2, which protruding section projects from an interlayer insulating film 41, is formed in the shape of a circular cylinder or the shape of a prism. The bottom surface of the shape of the circular cylinder or the shape of the prism is formed by a flat surface.

In forming such a projection electrode, an embedded electrode in the shape of a circular cylinder or the shape of a prism is first formed on the surface side of the interlayer insulating film 41 by an embedding method (damascene process). Suppose that at this time, the exposed surface of the embedded electrode is a flat surface. Thereafter, only the interlayer insulating film 41 is made to recede by etching, whereby a projection electrode obtained by allowing the embedded electrode to project to a desired height h from the interlayer insulating film 41 is formed.

On the other hand, the inner peripheral wall of a depression part 65*b'* provided in the center of a circuit side electrode 65' provided as a depression electrode in a circuit substrate 7 is formed in the shape of a circular cylinder or the shape of a prism which shape corresponds to the sensor side electrode 45'.

Suppose in this case that the aperture width w3 of the depression part 65*b'* is larger than the width w1 of the projection electrode formed earlier. Thus, the projection part of the projection electrode (sensor side electrode 45') can be fitted into the depression part 65*b'* of the depression electrode (circuit side electrode 65'). In addition, a process margin at the time of fitting the projection part of the projection electrode (sensor side electrode 45') into the depression part 65*b'* of the depression electrode (circuit side electrode 65') can be secured by designing the aperture width w3 of the depression part 65*b'* to be sufficiently larger than the width w1 of the projection electrode.

In addition, suppose that the depth d of the depression part 65*b'* does not exceed the height h of the projection electrode formed earlier. An end of the projection electrode is abutted against the deepest part of the depression part in a state of the projection part of the projection electrode (sensor side electrode 45') being fitted in the depression part 65*b'* of the depression electrode (circuit side electrode 65'). Further, the capacity of the depression part 65*b'* is desirably substantially equal to the volume of the protruding section of the projection electrode which protruding section protrudes from the interlayer insulating film within a range not less than the volume of the protruding section.

In forming such a depression electrode, an embedded electrode is first formed on the surface side of an interlayer insulating film 61 by an embedding method (damascene process). Suppose that at this time, the exposed surface of the embedded electrode is a flat surface. Thereafter, a mask pattern having an opening for exposing the central part of the embedded electrode is formed, and the central part of the embedded electrode is subjected to anisotropic etching from above the mask pattern, whereby the depression electrode (circuit side electrode 65') having the depression part 65b' is formed in the central part. At this time, it suffices to make the opening of the mask pattern into a circular shape when the inner peripheral wall of the depression part 65b' has the shape of a circular cylinder, or to make the opening of the mask pattern into a quadrangular shape when the inner peripheral wall of the depression part 65b' has the shape of a quadrangular prism.

The projection electrode as the sensor side electrode 45' as described above is fitted into the depression electrode as the circuit side electrode 65' in a one-to-one correspondence with each other. Thus, the sensor substrate 2 and the circuit substrate 7 are laminated to each other on a self-alignment basis. In this state, the vertex part of the projection electrode (sensor side electrode 45') is desirably abutted against the bottom part of the depression part 65b' of the depression electrode (circuit side electrode 65').

[FIG. 11B]

In this state, as shown in FIG. 11B, the projection electrode (sensor side electrode 45') and the depression electrode (circuit side electrode 65') are joined to each other by performing heat treatment. In addition, the interlayer insulating film 41 of the sensor substrate 2 and the interlayer insulating film 61 of the circuit substrate 7 are joined to each other. Such heat treatment is performed in a similar manner to that of the first embodiment.

[Action and Effect of Second Embodiment]

According to the solid-state imaging element 1' according to the second embodiment described above, the sensor side electrode 45' is formed as a projection electrode in the shape of a circular cylinder or the shape of a prism, the circuit side electrode 65' is formed as a depression electrode corresponding to the projection electrode, and the projection electrode is fitted into and joined to the depression electrode. A joining area between the sensor side electrode 45' and the circuit side electrode 65' is larger than in a case where flat electrodes are joined to each other and a case where a projection electrode and a depression electrode formed with a curved surface as described in the first embodiment are joined to each other. Thus, even when a void occurs at the joining surface between the sensor side electrode 45' and the circuit side electrode 65' in a joining process, for example, a substantial joining area can be secured. Such an effect is greater than in the first embodiment.

As a result, in the solid-state imaging element 1' of the three-dimensional structure formed by laminating the sensor substrate 2 and the circuit substrate 7 in such a manner as to join the electrodes 45' and 65' to each other, it is possible to prevent an increase in contact resistance between the electrodes 45' and 65' and secure a joining strength more reliably, and thus improve reliability.

In addition, even in the case of the method of fitting a projection electrode in the shape of a circular cylinder or the shape of a prism as described above into a depression electrode of a shape corresponding to the projection electrode, the sensor substrate 2 and the circuit substrate 7 can be aligned to each other with good accuracy on a self-alignment basis, as in the first embodiment.

By designing the aperture width w3 of the depression part 65b' in the depression electrode (circuit side electrode 65') to be sufficiently larger than the width w1 of the projection electrode at this time, a process margin at the time of fitting the projection electrode into the depression electrode can be secured, as in the first embodiment.

Further, the height h of the projection part of the projection electrode is made larger than the depth d of the depression part 65b' in the depression electrode (circuit side electrode 65'), whereby an end of the projection electrode is abutted against the deepest part of the depression part 65b' in the depression electrode (circuit side electrode 65'). Thus, the joining between the electrodes 45' and 65' progresses promptly from the bottom surface as the end part of the projection electrode to the periphery.

Further, the capacity of the depression part 65b' in the depression electrode (circuit side electrode 65') is desirably substantially equal to the volume of the protruding section of the projection electrode (sensor side electrode 45') which protruding section protrudes from the interlayer insulating film 41 within a range not less than the volume of the protruding section. Thus, in a state in which the electrodes 45' and 65' are joined to each other, the projection electrode is completely housed within the depression electrode, and the interlayer insulating film 41 of the sensor substrate 2 and the interlayer insulating film 61 of the circuit substrate 7 can be in close contact with each other, as in the first embodiment.

Incidentally, as shown in FIG. 11B, when there is a large difference between the capacity of the depression part 65b' and the volume of the protruding section in the projection electrode, voids can occur in the vicinity of the interface between the sensor substrate 2 and the circuit substrate 7. It is therefore desirable that the capacity of the depression part 65b' and the volume of the protruding section in the projection electrode be substantially the same, as in the first embodiment.

«7. Constitution of and Method for Manufacture of Solid-State Imaging Element according to Third Embodiment»

Figure 12A:
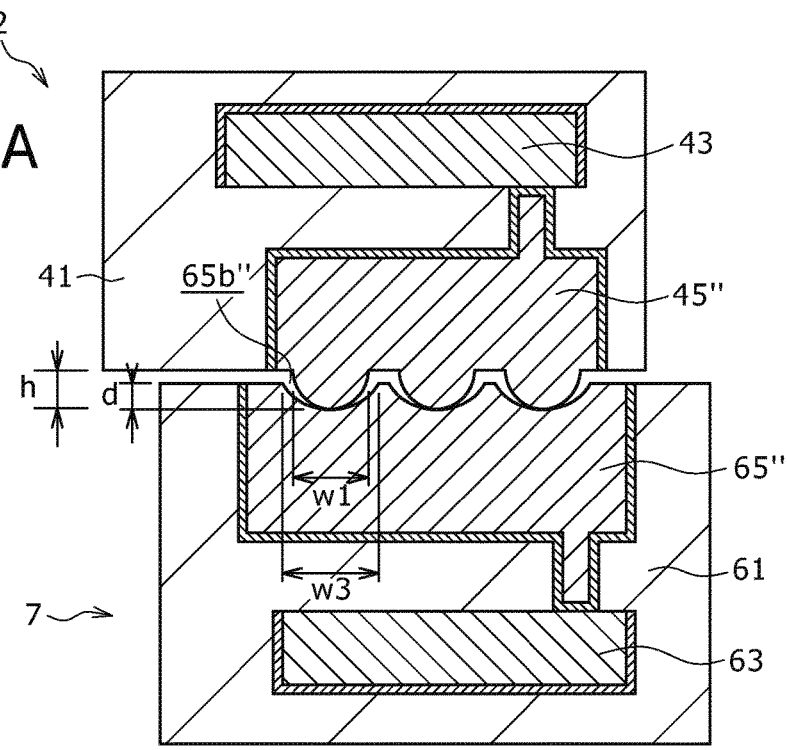
FIGS. 12A and 12B are principal part sectional views of parts of a solid-state imaging element according to a third embodiment.
Figure 12B:
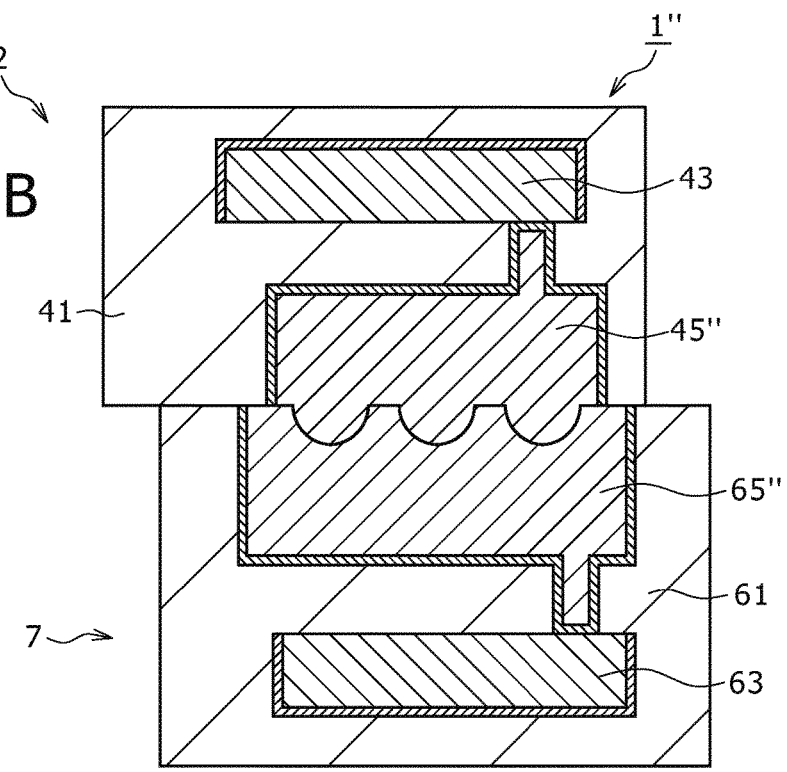

FIGS. 12A and 12B are principal part sectional process views showing parts of a solid-state imaging element according to a third embodiment and the joining of electrodes. The third embodiment will be described in the following with reference to FIGS. 12A and 12B. A difference between the solid-state imaging element 1" according to the third embodiment shown in FIGS. 12A and 12B and the solid-state imaging element according to the first embodiment described earlier lies in the shape of projection electrodes and depression electrodes, and suppose that the other constitution of the solid-state imaging element 1" according to the third embodiment is similar to that of the solid-state imaging element according to the first embodiment.

[FIG. 12A]

As shown in FIG. 12A, a sensor side electrode 45" provided as a projection electrode in a sensor substrate 2 has a plurality of protruding sections protruding from an interlayer insulating film 41. Each protruding section for example has a convex curved surface in a substantially hemispheric shape as described in the first embodiment, or is formed in the shape of a circular cylinder or the shape of a prism as described in the second embodiment. In this case, one projection electrode formed as the sensor side electrode 45" is shown having three convex curved surfaces in a substantially hemispheric shape.

In forming such a projection electrode, an embedded electrode is first formed on the surface side of the interlayer insulating film 41 by an embedding method (damascene process). Suppose that at this time, the exposed surface of the embedded electrode is a flat surface. Thereafter, a mask pattern covering a plurality of parts of the exposed surface of the embedded electrode is formed, and the embedded electrode and the interlayer insulating film 41 are made to recede by etching from above the mask pattern, so that a plurality of protruding sections are formed on the embedded electrode. Thereafter, the protruding sections are formed into a convex curved surface by performing CMP or isotropic etching. Thus, the projection electrode having electrodes projected to a desired height h from the interlayer insulating film 41 is formed.

On the other hand, a circuit side electrode 65" provided as a depression electrode in a circuit substrate 7 has a plurality of depression parts 65b" in the central part of a surface facing the side of the sensor substrate 2. The inner peripheral wall of each depression part 65b" is formed by the electrode surface of the circuit side electrode 65", and is formed with a concave curved surface or in the shape of a circular cylinder or the shape of a prism corresponding to the protruding sections formed in the projection electrode formed as the sensor side electrode 45". In this case, one depression electrode formed as the circuit side electrode 65" is shown having three depression parts 65b".

Suppose in this case that the aperture width w3 of each depression part 65b" is larger than the width w1 of the projection electrode formed earlier. Thus, the projection parts of the projection electrode (sensor side electrode 45") can be fitted into the respective depression parts 65b" of the depression electrode (circuit side electrode 65"). In addition, a process margin at the time of fitting the projection parts of the projection electrode (sensor side electrode 45") into the depression parts 65b" of the depression electrode can be secured by designing the aperture width w3 of the depression parts 65b" to be sufficiently larger than the width w1 of the projection parts of the projection electrode.

In addition, suppose that the depth d of the depression parts 65b" does not exceed the height h of the projection electrode formed earlier. Thus, an end of the projection electrode is abutted against the deepest parts of the depression parts in a state of the projection parts of the projection electrode (sensor side electrode 45") being fitted in the depression parts 65b" of the depression electrode (circuit side electrode 65"). Further, the capacity of the depression parts 65b" is desirably substantially equal to the volume of the protruding sections of the projection electrode which protruding sections protrude from the interlayer insulating film within a range not less than the volume of the protruding sections.

In forming such a depression electrode, an embedded electrode is first formed on the surface side of an interlayer insulating film 61 by an embedding method (damascene process). Suppose that at this time, the exposed surface of the embedded electrode is a flat surface. Thereafter, a mask pattern having openings for exposing a plurality of parts of the exposed surface of the embedded electrode is formed. Next, the formation and etching of a transformed layer similar to that described with reference to FIGS. 6A to 6D in the first embodiment is repeated, or CMP is performed in a similar manner to that described with reference to FIGS. 7A and 7B, whereby the depression electrode 65" having the plurality of depression parts 65b" is formed.

The projection electrode as the sensor side electrode 45" as described above is fitted into the depression electrode as the circuit side electrode 65" in a one-to-one correspondence with each other. Thus, the sensor substrate 2 and the circuit substrate 7 are laminated to each other on a self-alignment basis. In this state, the vertex parts of the protruding sections of the projection electrode (sensor side electrode 45") are desirably abutted against the bottom parts of the respective depression parts 65b" of the depression electrode (circuit side electrode 65").

[FIG. 12B]

In this state, as shown in FIG. 12B, the projection electrode (sensor side electrode 45") and the depression electrode (circuit side electrode 65") are joined to each other by performing heat treatment. In addition, the interlayer insulating film 41 of the sensor substrate 2 and the interlayer insulating film 61 of the circuit substrate 7 are joined to each other. Such heat treatment is performed in a similar manner to that of the first embodiment.

[Action and Effect of Third Embodiment]

According to the solid-state imaging element 1" according to the third embodiment described above, the sensor side electrode 45" is formed as a projection electrode having a plurality of protruding sections, the circuit side electrode 65" is formed as a depression electrode having a plurality of depression parts 65b" corresponding to the projection electrode, and the projection electrode is fitted into and joined to the depression electrode. A joining area between the sensor side electrode 45" and the circuit side electrode 65" is larger than in a case where flat electrodes are joined to each other, as in the first embodiment. Thus, even when a void occurs at the joining surface between the sensor side electrode 45" and the circuit side electrode 65" in a joining process, for example, a substantial joining area can be secured.

As a result, in the solid-state imaging element 1" of the three-dimensional structure formed by laminating the sensor substrate 2 and the circuit substrate 7 in such a manner as to join the electrodes 45" and 65" to each other, it is possible to prevent an increase in contact resistance between the electrodes 45" and 65" and secure a joining strength more reliably, and thus improve reliability.

In addition, as in the first embodiment, because of the method of fitting the projection electrode into the depression electrode of a shape corresponding to the projection electrode, the sensor substrate 2 and the circuit substrate 7 can be aligned to each other with good accuracy on a self-alignment basis.

In addition, the size and shape of each depression part 65b" in the depression electrode (circuit side electrode 65") as well as the size and shape of each protruding section in the projection electrode (sensor side electrode 45") are similar to those of the first embodiment. Therefore similar effects to those of the first embodiment can be obtained.

Incidentally, in each of the foregoing embodiments, the sensor side electrode is a projection electrode, and the circuit side electrode is a depression electrode. However, in the present technology, either of the sensor side electrode and the circuit side electrode may be a projection electrode or a depression electrode as long as the sensor side electrode and the circuit side electrode are jointed to each other in a state of the projection electrode being fitted in the depression electrode. In addition, a projection electrode and a depression electrode may be provided as sensor side electrodes, and a depression electrode and a projection electrode to be fitted into the sensor side electrodes may be provided as circuit side electrodes corresponding to the respective sensor side electrodes.

In addition, in each of the above embodiments, description has been made of a case where the depression electrodes and the projection electrodes forming the sensor side electrodes and the circuit side electrodes are formed of copper (Cu). However, the depression electrodes and the projection electrodes are not limited to this. It suffices for the depression electrodes and the projection electrodes to be formed of a material enabling the depression electrodes and the projection electrodes to be joined to each other while retaining a good contact property. For example, aluminum or a metal silicide material such as tungsten silicide or the like can be used for the depression electrodes and the projection electrodes.

In cases where these materials are used, for the formation of the projection electrodes, the electrodes can be pattern-formed on an interlayer insulating film by etching a material film with a resist pattern formed by a lithography method used as a mask. In addition, the electrodes can be formed into the shape of a convex curved surface by thereafter performing CMP.

On the other hand, for the formation of the depression electrodes, a method similar to that of the foregoing embodiments can be applied with process conditions changed as appropriate. In addition, the electrodes are pattern-formed on an interlayer insulating film by etching a material film with a resist pattern formed by a lithography method used as a mask, and further an interlayer insulating film covering the electrodes is formed. Thereafter, the electrode pattern is exposed by CMP, and then depression parts may be formed in the electrode pattern in a similar manner to that described with reference to FIGS. 6A to 6D or FIGS. 7A and 7B in the first embodiment.

In addition, the respective surfaces of the depression electrodes and the projection electrodes may be formed by rough surfaces. Such rough surfaces are formed by a surface roughening process such as a sandblasting process or the like after the formation of the electrodes, for example. Thus making the surfaces of the depression electrodes and the projection electrodes rough surfaces can further increase a joining area, and thus further increase a joining strength.

«8. Embodiment of Electronic Device»

The solid-state imaging element described in each of the foregoing embodiments of the present technology is for example applicable to electronic devices including camera systems such as digital cameras, video cameras, and the like, portable telephones having an imaging function, or other devices having an imaging function.

Figure 13:
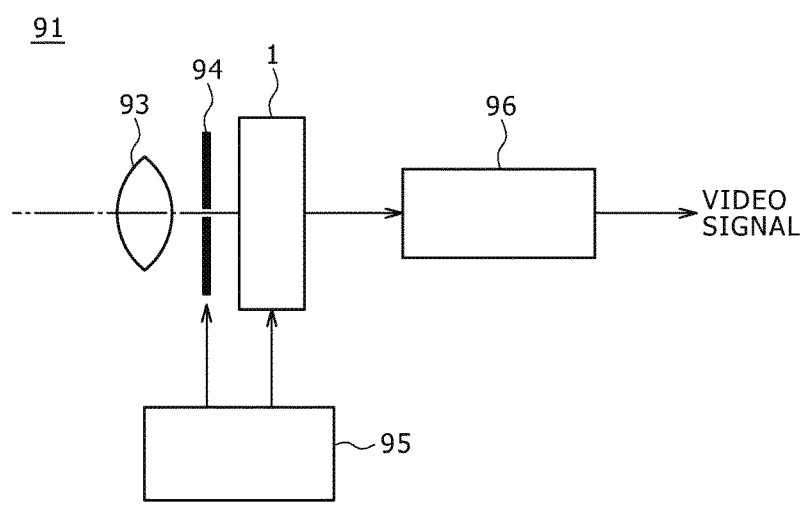
FIG. 13 is a block diagram of an electronic device according to an embodiment of the present technology.

FIG. 13 is a block diagram of a camera using a solid-state imaging element as an example of an electronic device according to the present technology. The camera according to the example of a present embodiment is an example of a video camera capable of photographing a still image or a moving image. The camera 91 according to the example of the present embodiment includes: a solid-state imaging element 1; an optical system 93 for guiding incident light to a light receiving sensor section of the solid-state imaging element 1; a shutter device 94; a driving circuit 95 for driving the solid-state imaging element 1; and a signal processing circuit 96 for processing an output signal of the solid-state imaging element 1.

The solid-state imaging elements (1, 1', and 1") of the constitutions described in the foregoing respective embodiments are applied as the solid-state imaging element 1. The optical system (optical lens) 93 forms image light (incident light) from a subject on an imaging surface of the solid-state imaging element 1. Thus, a signal charge is accumulated within the solid-state imaging element 1 in a certain period. The optical system 93 may be an optical lens system composed of a plurality of optical lenses. The shutter device 94 controls a period of irradiation of the solid-state imaging element 1 with light and a period of shielding the solid-state imaging element 1 from light. The driving circuit 95 supplies a driving signal for controlling the transfer operation of the solid-state imaging element 1 and the shutter operation of the shutter device 94. The signal transfer of the solid-state imaging element 1 is performed according to the driving signal (timing signal) supplied from the driving circuit 95. The signal processing circuit 96 performs various signal processing. A video signal resulting from the signal processing is stored on a storage medium such as a memory or the like, or output to a monitor.

The electronic device according to the present embodiment described above can be miniaturized and improved in reliability by using the solid-state imaging element 1 of the highly reliable three-dimensional structure in which the sensor substrate and the circuit substrate are laminated to each other.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a first substrate;
    a second substrate laminated to the first substrate;
    a projection electrode extending to a first surface of the first substrate which faces the second substrate, wherein the projection electrode includes a projecting surface that projects from the first surface of the first substrate;
    a depression electrode extending to a second surface of the second substrate which faces the first substrate and joined to the projection electrode in a state of the projection electrode and the depression electrode being fitted together such that the projecting surface and a side surface of the projection electrode is in physical and electrical contact with a recessed surface and a side surface of the depression electrode, and the first surface of the first substrate and the second surface of the second substrate being in direct physical contact with one another, wherein the recessed surface of the depression electrode recedes from the second surface of the second substrate; and
    at least one of:
    a first barrier layer covering a part of the projection electrode and in direct physical contact with the first substrate, or
    a second barrier layer covering a part of the depression electrode and in direct physical contact with the second substrate.

2. The semiconductor device according to claim 1, wherein
    in a case where the part of the projection electrode is covered by the first barrier layer, the first barrier layer is disposed between the projection electrode and the first substrate, and
    in a case where the part of the depression electrode is covered by the second barrier layer, the second barrier layer is disposed between the depression electrode and the second substrate.

3. The semiconductor device according to claim 1, wherein the first barrier layer and the second barrier layer include tantalum or titanium.

4. The semiconductor device according to claim 1, wherein the first barrier layer includes a metal nitride.

5. The semiconductor device according to claim 1, wherein the projecting surface and the side surface of the projection electrode define an outer circumference that is surrounded by the depression electrode.

6. The semiconductor device according to claim 1, wherein:
the first substrate includes a first insulating film surrounding the projection electrode; and
the second substrate includes a second insulating film surrounding the depression electrode,
wherein the first insulating film and the second insulating film are in close contact with each other.

7. The semiconductor device according to claim 6, wherein the first insulating film and the second insulating film include silicon and oxygen.

8. The semiconductor device according to claim 1, wherein the first substrate includes a photoelectric conversion device.

9. The semiconductor device according to claim 1, wherein
the projecting surface of the projection electrode comprises a plurality of projection parts; and
the recessed surface of the depression electrode comprises a plurality of depression parts.

10. A method of manufacturing a semiconductor device, comprising:
providing a first substrate;
providing a second substrate;
forming a projection electrode in a first surface of the first substrate which faces the second substrate, wherein the projection electrode includes a projecting surface that projects from the first surface of the first substrate;
forming a depression electrode in a second surface of the second substrate which faces the first substrate, wherein the depression electrode includes a recessed surface that recedes from the second surface of the second substrate;
at least one of:
forming a first barrier layer covering a part of the projection electrode and in direct physical contact with the first substrate, or
forming a second barrier layer covering a part of the depression electrode and in direct physical contact with the second substrate; and
laminating the second substrate to the first substrate such that the depression electrode is joined to the projection electrode in a state of the projection electrode and the depression electrode being fitted together such that the projecting surface and a side surface of the projection electrode is in physical and electrical contact with the recessed surface and a side surface of the depression electrode, and the first surface of the first substrate and the second surface of the second substrate being in direct physical contact with one another.

11. The method according to claim 10, wherein
in a case where the part of the projection electrode is covered by the first barrier layer, the first barrier layer is disposed between the projection electrode and the first substrate, and
in a case where the part of the depression electrode is covered by the second barrier layer, the second barrier layer is disposed between the depression electrode and the second substrate.

12. The method according to claim 10, wherein the first barrier layer and the second barrier layer include tantalum or titanium.

13. The method according to claim 10, wherein the first barrier layer includes a metal nitride.

14. The method according to claim 10, wherein the projecting surface and the side surface of the projection electrode define an outer circumference that is surrounded by the depression electrode.

15. The method according to claim 10, wherein:
the first substrate includes a first insulating film surrounding the projection electrode; and
the second substrate includes a second insulating film surrounding the depression electrode,
wherein the first insulating film and the second insulating film are in close contact with each other.

16. The method according to claim 15, wherein the first insulating film and the second insulating film include silicon and oxygen.

17. The method according to claim 10, wherein the first substrate includes a photoelectric conversion device.

18. The method according to claim 10, wherein
the projecting surface of the projection electrode comprises a plurality of projection parts; and
the recessed surface of the depression electrode comprises a plurality of depression parts.

19. An electronic apparatus comprising:
a semiconductor device including:
a first substrate,
a second substrate laminated to the first substrate,
a projection electrode extending to a first surface of the first substrate which faces the second substrate, wherein the projection electrode includes a projecting surface that projects from the first surface of the first substrate,
a depression electrode extending to a second surface of the second substrate which faces the first substrate and joined to the projection electrode in a state of the projection electrode and the depression electrode being fitted together such that the projecting surface and a side surface of the projection electrode is in physical and electrical contact with a recessed surface and a side surface of the depression electrode, and the first surface of the first substrate and the second surface of the second substrate being in direct physical contact with one another, wherein the recessed surface of the depression electrode recedes from the second surface of the second substrate, and
at least one of:
a first barrier layer covering a part of the projection electrode and in direct physical contact with the first substrate, or
a second barrier layer covering a part of the depression electrode and in direct physical contact with the second substrate.

20. The electronic apparatus according to claim 19, wherein
in a case where the part of the projection electrode is covered by the first barrier layer, the first barrier layer is disposed between the projection electrode and the first substrate, and
in a case where the part of the depression electrode is covered by the second barrier layer, the second barrier layer is disposed between the depression electrode and the second substrate.

* * * * *